(12) United States Patent
Qian et al.

(10) Patent No.: US 12,391,546 B1
(45) Date of Patent: Aug. 19, 2025

(54) METHOD OF MAKING ACOUSTIC DEVICES WITH DIRECTIONAL REINFORCEMENT

(71) Applicant: Skyworks Global Pte. Ltd., Singapore (SG)

(72) Inventors: You Qian, Singapore (SG); Rakesh Kumar, Singapore (SG); Guofeng Chen, Fremont, CA (US); Myeong Gweon Gu, Seoul (KR); Myung Hyun Park, Seongnam-si (KR); Jae Hyung Lee, Seoul (KR); Michael Jon Wurtz, Lake Oswego, OR (US)

(73) Assignee: Skyworks Global Pte. Ltd., Singapore (SG)

( * ) Notice: Subject to any disclaimer, the term of this patent is extended or adjusted under 35 U.S.C. 154(b) by 520 days.

(21) Appl. No.: 17/647,224

(22) Filed: Jan. 6, 2022

Related U.S. Application Data

(60) Provisional application No. 63/134,755, filed on Jan. 7, 2021, provisional application No. 63/134,746, filed on Jan. 7, 2021.

(51) Int. Cl.
*B81C 1/00* (2006.01)
*H10N 30/06* (2023.01)
*H10N 30/084* (2023.01)

(52) U.S. Cl.
CPC ........... *B81C 1/0015* (2013.01); *H10N 30/06* (2023.02); *H10N 30/084* (2023.02); *B81B 2201/0257* (2013.01)

(58) Field of Classification Search
CPC .... B81C 1/0015; H10N 30/06; H10N 30/084; B81B 2201/0257
See application file for complete search history.

(56) References Cited

U.S. PATENT DOCUMENTS

| | | | |
|---|---|---|---|
| 5,883,705 A | 3/1999 | Minne et al. | |
| 6,028,389 A * | 2/2000 | Bernstein | H04R 17/00 310/311 |
| 6,657,517 B2 | 12/2003 | Barber | |

(Continued)

FOREIGN PATENT DOCUMENTS

| | | |
|---|---|---|
| CN | 109495829 A | 3/2019 |
| CN | 110545514 A | 12/2019 |

(Continued)

*Primary Examiner* — Jeffrey T Carley
*Assistant Examiner* — Jose K Abraham
(74) *Attorney, Agent, or Firm* — Knobbe, Martens, Olson & Bear LLP

(57) ABSTRACT

A method of making an acoustic sensor includes forming or providing a mold having one or more grooves extending in a direction of the length of the mold to a distal end of the mold. The method also includes forming or depositing a structure having one or more piezoelectric layers over the top surface of the mold to define a beam with a proximal portion and a distal portion, the distal portion having a corrugated section including one or more grooves that correspond to the one or more grooves of the mold. The method also includes forming or applying an electrode to the proximal portion of the structure and releasing the structure from the mold to form one or more cantilever beams. The corrugated section inhibits bending of the corrugated section along the length of the distal portion of the structure when the acoustic sensor is subjected to sound pressure.

14 Claims, 17 Drawing Sheets

(56) References Cited

U.S. PATENT DOCUMENTS

| | | |
|---|---|---|
| 6,857,501 B1 | 2/2005 | Han |
| 7,253,488 B2 | 8/2007 | Zhan et al. |
| 7,763,947 B2 | 7/2010 | Zhan et al. |
| 7,951,636 B2 * | 5/2011 | Lee .................... B81C 1/00246 |
| | | 257/419 |
| 8,466,606 B2 | 6/2013 | Chen |
| 8,531,088 B2 | 9/2013 | Grosh |
| 8,582,788 B2 | 11/2013 | Leidl et al. |
| 8,896,184 B2 | 11/2014 | Grosh et al. |
| 9,029,963 B2 | 5/2015 | Sparks et al. |
| 9,055,372 B2 | 6/2015 | Grosh |
| 9,386,379 B2 | 7/2016 | Sparks et al. |
| 9,479,875 B2 | 10/2016 | Hall |
| 9,516,421 B1 | 12/2016 | Loeppert |
| 9,853,201 B2 | 12/2017 | Grosh et al. |
| 10,001,391 B1 | 6/2018 | Littrell |
| 10,170,685 B2 | 1/2019 | Grosh et al. |
| 10,356,531 B2 | 7/2019 | Giusti et al. |
| 10,825,982 B1 | 11/2020 | Littrell et al. |
| 11,099,078 B1 | 8/2021 | Littrell |
| 11,159,893 B1 * | 10/2021 | Kervran ............... H04R 19/005 |
| 11,350,219 B2 | 5/2022 | Hui et al. |
| 11,553,280 B2 | 1/2023 | Hui et al. |
| 12,219,333 B2 | 2/2025 | Chen et al. |
| 2006/0230835 A1 | 10/2006 | Wang |
| 2008/0219469 A1 * | 9/2008 | Simidian ............... H04R 9/047 |
| | | 381/92 |
| 2009/0116662 A1 | 5/2009 | Wu |
| 2009/0301196 A1 | 12/2009 | Wang et al. |
| 2010/0132174 A1 | 6/2010 | Kim |
| 2010/0207495 A1 * | 8/2010 | Kikushima .......... H03H 9/1021 |
| | | 310/370 |
| 2011/0124124 A1 | 5/2011 | Shih et al. |
| 2012/0091546 A1 * | 4/2012 | Langereis ................ H04R 7/18 |
| | | 257/416 |
| 2012/0319217 A1 | 12/2012 | Dehe |
| 2013/0329920 A1 | 12/2013 | Grosh |
| 2015/0119758 A1 * | 4/2015 | Rogers ................ A61B 5/7203 |
| | | 600/586 |
| 2015/0255308 A1 | 9/2015 | Lin |
| 2015/0266717 A1 | 9/2015 | Okamoto |
| 2016/0249122 A1 | 8/2016 | Popper et al. |
| 2016/0258824 A1 | 9/2016 | Fuji |
| 2016/0315247 A1 * | 10/2016 | Boser .................. H10N 30/853 |
| 2016/0352309 A1 | 12/2016 | Xu et al. |
| 2017/0318385 A1 | 11/2017 | Harney et al. |
| 2018/0035229 A1 * | 2/2018 | Deas .................... H04R 31/006 |
| 2018/0077497 A1 | 3/2018 | Hatipoglu |
| 2018/0131543 A1 | 5/2018 | Li et al. |
| 2018/0138391 A1 | 5/2018 | Gros |
| 2018/0186623 A1 | 7/2018 | Vossough et al. |
| 2019/0016588 A1 * | 1/2019 | Bretthauer ............... B81B 3/00 |
| 2019/0028084 A1 | 1/2019 | Yoon |
| 2019/0141450 A1 | 5/2019 | Yoon |
| 2019/0177155 A1 | 6/2019 | Qian |
| 2019/0200119 A1 | 6/2019 | Kang et al. |
| 2019/0289405 A1 | 9/2019 | Littrell et al. |
| 2019/0297441 A1 * | 9/2019 | Dehe ..................... H04R 19/04 |
| 2019/0327562 A1 | 10/2019 | Cerini |
| 2019/0348050 A1 | 11/2019 | Kim et al. |
| 2019/0367355 A1 * | 12/2019 | Bretthauer ......... H10N 30/2047 |
| 2020/0148532 A1 | 5/2020 | Grosh et al. |
| 2020/0158564 A1 | 5/2020 | Yoon |
| 2020/0168402 A1 | 5/2020 | Eid |
| 2020/0370951 A1 | 11/2020 | Kang et al. |
| 2020/0408799 A1 * | 12/2020 | Littrell ................ H10N 30/802 |
| 2020/0409238 A1 * | 12/2020 | Chen ........................ G02B 7/09 |
| 2021/0021936 A1 | 1/2021 | Hui et al. |
| 2021/0051413 A1 | 2/2021 | Hui et al. |
| 2021/0051414 A1 | 2/2021 | Duan |
| 2021/0120345 A1 | 4/2021 | Hui et al. |
| 2021/0120346 A1 | 4/2021 | Hui et al. |
| 2021/0126615 A1 | 4/2021 | Yoon |
| 2021/0382085 A1 * | 12/2021 | Bretthauer ............... B81B 3/00 |
| 2022/0060814 A1 * | 2/2022 | Kang ..................... H04R 1/326 |
| 2022/0073342 A1 | 3/2022 | Ho |
| 2022/0166403 A1 | 5/2022 | Doll et al. |
| 2022/0408185 A1 | 12/2022 | Barsukou |
| 2023/0135200 A1 | 5/2023 | Qian et al. |
| 2023/0136347 A1 | 5/2023 | Qian et al. |
| 2023/0143656 A1 | 5/2023 | Littrell |

FOREIGN PATENT DOCUMENTS

| | | | |
|---|---|---|---|
| CN | 212850998 U | * 3/2021 | ........... H04R 31/003 |
| JP | 2010232971 A | 10/2010 | |
| JP | 2018 137297 A | 8/2018 | |
| JP | 2019-161030 | 9/2019 | |
| KR | 10-1545271 | 8/2015 | |
| TW | I727164 B | 5/2021 | |
| WO | WO 2017/200219 A1 | 11/2017 | |
| WO | WO 2021098562 A1 | 5/2021 | |
| WO | WO 2022 104932 A1 | 5/2022 | |

* cited by examiner

METHOD OF MAKING ACOUSTIC DEVICES WITH DIRECTIONAL REINFORCEMENT

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure is directed to acoustic devices, such as piezoelectric microelectromechanical systems (MEMS) microphones, and in particular to methods of making acoustic devices with directional reinforcement.

Description of the Related Art

A MEMS microphone is a micro-machined electromechanical device used to convert sound pressure (e.g., voice sound) to an electrical signal (e.g., voltage). MEMS microphones are widely used in mobile devices, headsets, smart speakers and other voice-interface devices or systems. Conventional capacitive MEMS microphones suffer from high power consumption (e.g., large bias voltage) and reliability, for example when used in a harsh environment (e.g., when exposed to dust and/or water).

Piezoelectric MEMS microphones have been used to address the deficiencies of capacitive MEMS microphones. Piezoelectric MEMS microphones offer a constant listening capability while consuming almost no power (e.g., no bias voltage is needed), are robust and immune to water and dust contamination. Existing piezoelectric MEMS microphones include cantilever MEMS structures, and are mostly based on sputter-deposited thin film piezoelectric structure. Such thin piezoelectric film suffers from large residual stress and stress gradient across the film thickness after deposition which results in sensitivity degradation and variation. The cantilever MEMS structure suffers from poor low-frequency roll-off control as the gap between cantilevers varies due to cantilever deflection induced by residual stress and stress gradient of the piezoelectric film for a single or multiple films stacked together. Additionally, the cantilever MEMS structure with gap control mechanism can have a complex structure that results in higher manufacturing costs and poor reliability performance.

SUMMARY

Accordingly, there is a need for an improved acoustic device with directional reinforcement that can be used, for example, in piezoelectric MEMS microphones and do not suffer the deficiencies in existing MEMS cantilever structures.

In accordance with one aspect of the disclosure, an acoustic sensor (e.g., for use in a piezoelectric MEMS microphone) is provided that includes a substrate and a cantilever beam attached to the substrate. The cantilever beam has a proximal portion attached to the substrate and a distal portion that extends from the proximal portion to a free end of the beam, the beam extending in a first direction between the proximal portion and the free end, the distal portion of the beam having a corrugated section including one or more grooves that extend generally in the first direction. Sound pressure exerted on the beam causes the beam, including the corrugated section to bend. The corrugated section inhibits bending along the length of the distal portion when the acoustic sensor is subjected to sound pressure. An electrode is disposed on or in the proximal portion of the beam.

In accordance with another aspect of the disclosure, a piezoelectric sensor for a piezoelectric MEMS microphone is provided. The sensor comprises a substrate and a cantilever beam. The cantilevered beam has a proximal portion attached to the substrate and a distal portion that extends from the proximal portion to a free end of the beam. The beam extends in a first direction between the proximal portion and the free end, the distal portion of the beam having a corrugated section including one or more grooves that extend generally in the first direction. An electrode is disposed on or in the proximal portion of the beam.

In accordance with another aspect of the disclosure, a piezoelectric MEMS microphone is provided. The microphone comprises a substrate and a plurality of piezoelectric sensors movably coupled to the substrate. Each of the piezoelectric sensors are spaced apart from an adjacent piezoelectric sensor by a gap. Each piezoelectric sensor includes a cantilever beam having a proximal portion attached to the substrate and a distal portion that extends from the proximal portion to a free end of the beam. The beam extends in a first direction between the proximal portion and the free end. The distal portion of the beam has a corrugated section including one or more grooves that extend generally in the first direction, and an electrode disposed on or in the proximal portion of the beam. The plurality of piezoelectric sensors are configured to deflect when subjected to sound pressure.

In accordance with another aspect of the disclosure, an audio subsystem is provided. The audio subsystem comprises an audio codec and one or more piezoelectric MEMS microphones in communication with the audio codec. Each microphone includes a substrate and a plurality of piezoelectric sensors movably coupled to the substrate. Each of the piezoelectric sensors are spaced apart from an adjacent piezoelectric sensor by a gap. Each piezoelectric sensor includes a cantilever beam having a proximal portion attached to the substrate and a distal portion that extends from the proximal portion to a free end of the beam. The beam extends in a first direction between the proximal portion and the free end. The distal portion of the beam has a corrugated section including one or more grooves that extend generally in the first direction, and an electrode disposed on or in the proximal portion of the beam.

In accordance with another aspect of the disclosure, an electronic device is provided. The electronic device comprises a processor and an audio subsystem that communicates with the processor. The audio subsystem comprises one or more piezoelectric MEMS microphones on a substrate layer. Each microphone includes a substrate and a plurality of piezoelectric sensors movably coupled to the substrate. Each of the piezoelectric sensors are spaced apart from an adjacent piezoelectric sensor by a gap. Each piezoelectric sensor includes a cantilevered beam having a proximal portion attached to the substrate and a distal portion that extends from the proximal portion to a free end of the beam. The beam extends in a first direction between the proximal portion and the free end. The distal portion of the beam has a corrugated section including one or more grooves that extend generally in the first direction, and an electrode disposed on or in the proximal portion of the beam.

In accordance with another aspect of the disclosure, a method of making an acoustic sensor (e.g., a piezoelectric sensor for a piezoelectric MEMS microphone) is provided. The method comprises forming or providing a mold extending along a length and having one or more grooves in a top surface of the mold, the one or more grooves extending in a direction of the length of the mold to a distal end of the mold. The method also comprises forming or depositing a structure having one or more piezoelectric layers over the top surface of the mold to define a beam with a proximal portion and a distal portion, the distal portion having a corrugated section including one or more grooves that correspond to the one or more grooves of the mold. The method further comprises releasing the structure from the mold to form a cantilever.

In accordance with another aspect of the disclosure, a method of making an electronic device is provided. The method comprises forming or providing a printed circuit board that includes a substrate layer. The method also comprises forming or providing one or more piezoelectric microelectromechanical systems microphones via a process comprising (a) forming or providing a mold extending along a length and having one or more grooves in a top surface of the mold, the one or more grooves extending in a direction of the length of the mold to a distal end of the mold, (b) forming or depositing a structure having one or more piezoelectric layers over the top surface of the mold to define a beam with a proximal portion and a distal portion, the distal portion having a corrugated section including one or more grooves that correspond to the one or more grooves of the mold, (c) releasing the structure from the mold, and (d) leaving a part of the structure attached to a substrate in a cantilevered manner to form a cantilever beam that deflects when subjected to sound pressure. The method also comprises mounting the one or more piezoelectric microelectromechanical systems microphones on the printed circuit board.

DETAILED DESCRIPTION

Figure 1:
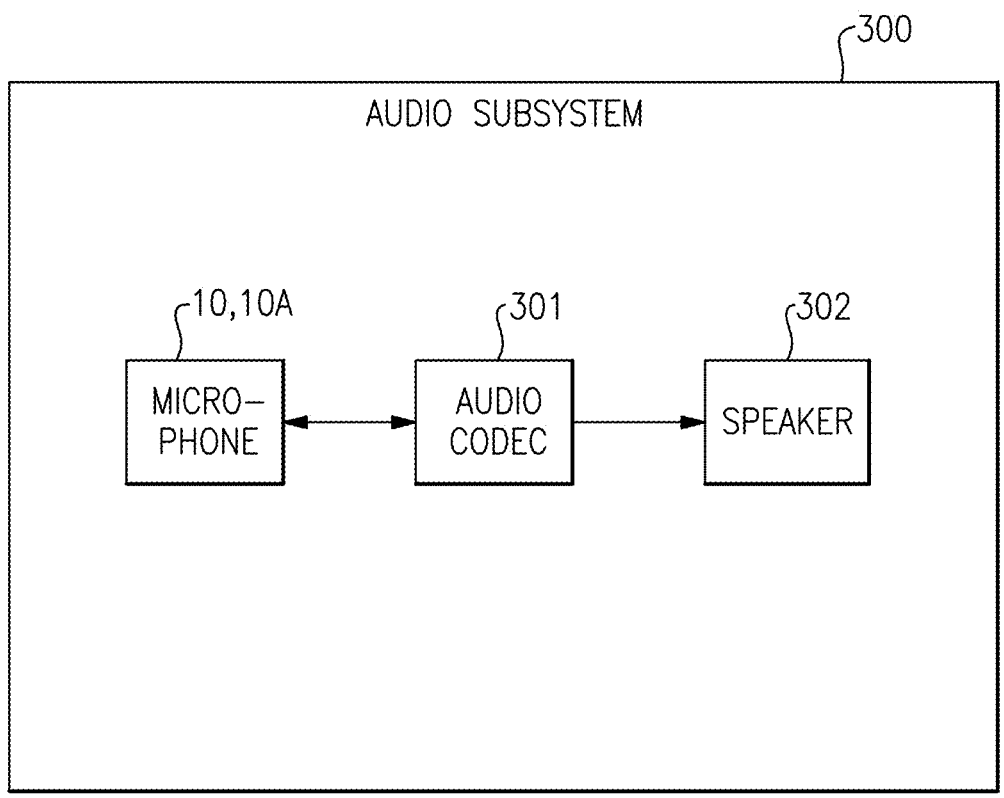
FIG. 1 is a schematic diagram of an audio subsystem.

The following detailed description of certain embodiments presents various descriptions of specific embodiments. However, the innovations described herein can be embodied in a multitude of different ways, for example, as defined and covered by the claims. In this description, reference is made to the drawings were like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of an audio subsystem 300. The audio subsystem 300 can include one or more microphones 10, 10A. In one implementation, at least one of the microphone(s) 10, 10A is a piezoelectric MEMS microphone. The microphone(s) 10, 10A can communicate with an audio codec 301, which can control the operation of the microphone(s) 10, 10A. The audio codec 301 can also communicate with a speaker 302 and control the operation of the speaker 302.

Figure 2A:
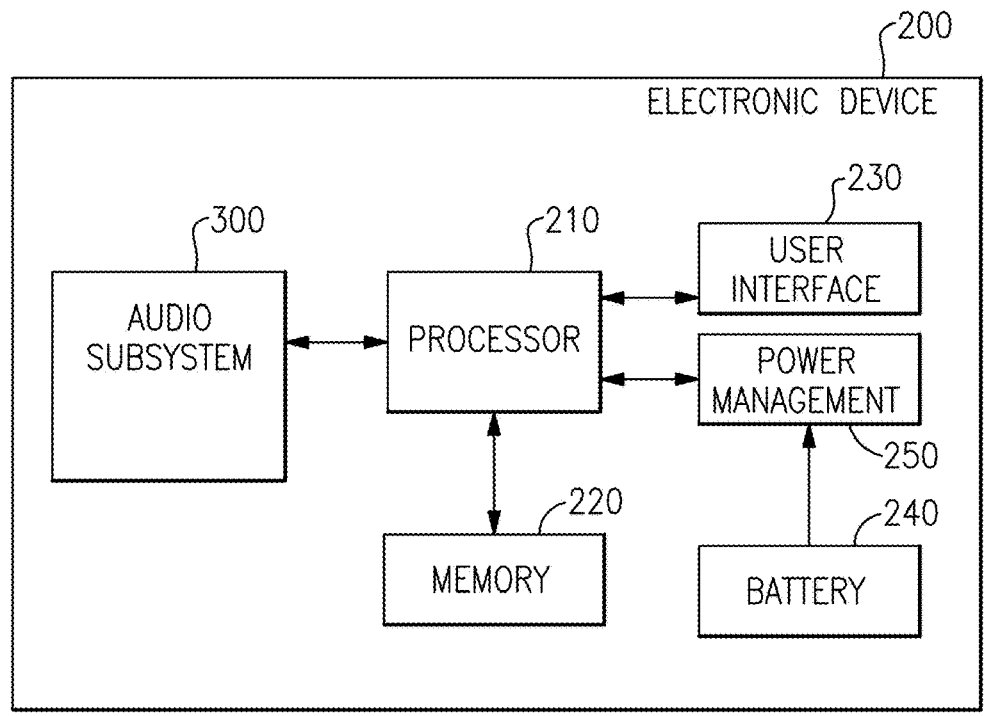
FIG. 2A is a schematic diagram of an electronic device.

FIG. 2A is a schematic diagram of an electronic device 200 that includes the audio subsystem 300. The electronic device 200 can optionally have one or more of a processor 210, a memory 220, a user interface 230, a battery 240 (e.g., direct current (DC) battery) and a power management module 250. Other additional components, such a display and keyboard can optionally be connected to the processor 210. The battery 240 can provide power to the electronic device 200.

It should be noted that, for simplicity, only certain components of the electronic device 200 are illustrated herein. The control signals provided by the processor 210 control the various components within the electronic device 200.

The processor 210 communicates with the user interface 220 to facilitate processing of various user input and output (I/O), such as voice and data. As shown in FIG. 2A, the processor 210 communicates with the memory 220 to facilitate operation of the electronic device 200.

The memory 220 can be used for a wide variety of purposes, such as storing data and/or instructions to facilitate the operation of the electronic device 200 and/or to provide storage of user information.

The power management system or module 250 provides a number of power management functions of the electronic device 200. In certain implementations, the power management system 250 includes a PA supply control circuit that controls the supply voltages of power amplifiers. For example, the power management system 250 can change the supply voltage(s) provided to one or more power amplifiers to improve efficiency.

As shown in FIG. 2A, the power management system 250 receives a battery voltage from the battery 240. The battery 240 can be any suitable battery for use in the electronic device 200, including, for example, a lithium-ion battery.

Figure 2B:
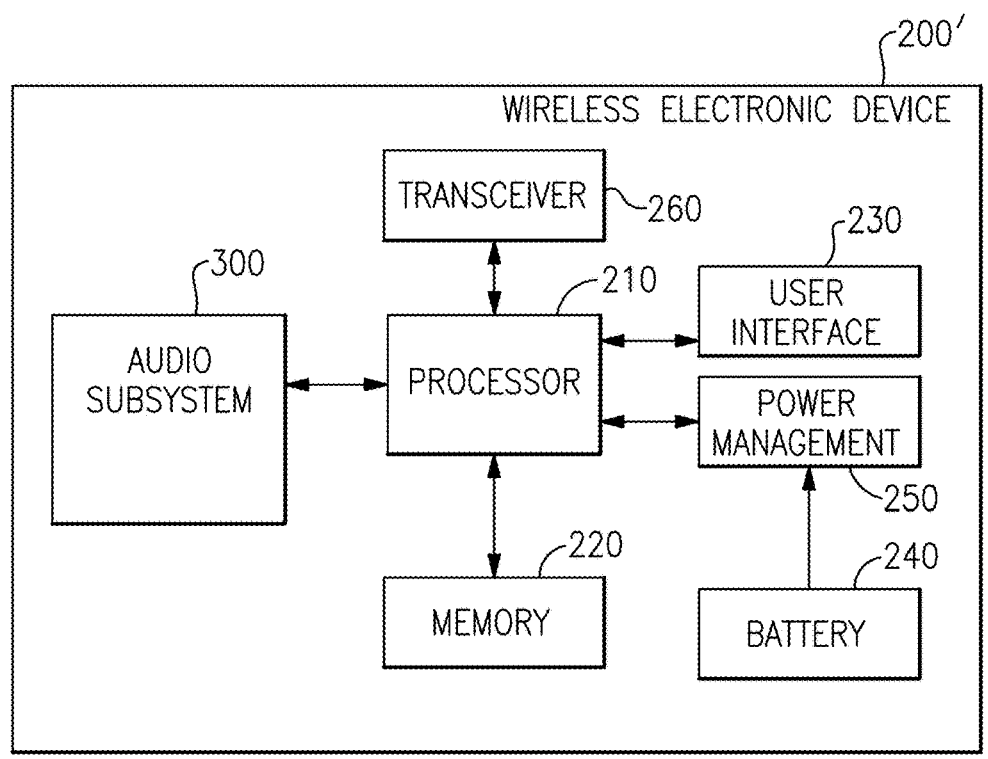
FIG. 2B is a schematic diagram of a wireless electronic device.

FIG. 2B is a schematic diagram of a wireless electronic device 200'. The wireless electronic device 200' is similar to the electronic device 200 in FIG. 2A. Thus, reference numerals used to designate the various components of the wireless electronic device 200' are identical to those used for identifying the corresponding components of the electronic device 200 in FIG. 2A. Therefore, the structure and description above for the various features of the electronic device 200 in FIG. 2A are understood to also apply to the corresponding features of the wireless electronic device 200' in FIG. 2B, except as described below.

The wireless electronic device 200' differs from the electronic device 200 in that it also includes a transceiver 260 that communicates (e.g., two-way communication) with the processor 210. Signals, data and/or information received (e.g., wirelessly) by the transceiver 260 (e.g., from a remote electronic device, such a smartphone, tablet computer, etc.) is communicated to the processor 210, and signals, data and/or information provided by the processor is communicated (e.g., wirelessly) by the transceiver 260 (e.g., to a remote electronic device). Further, the function of the transceiver 260 can be integrated into separate transmitter and receiver components.

The wireless electronic device 200' can be used to communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 260 generates RF signals for transmission and processes incoming RF signals received from antennas. It will be understood that various functionalities associated with the transmission and receiving of RF signals can be achieved by one or more components that are collectively represented in FIG. 2B as the transceiver 260. In one example, separate components (for instance, separate circuits or dies) can be provided for handling certain types of RF signals.

The processor 210 provides the transceiver 260 with digital representations of transmit signals, which the transceiver 260 processes to generate RF signals for transmission. The processor 210 also processes digital representations of received signals provided by the transceiver 260.

Piezoelectric MEMS Microphone

Figure 3A:
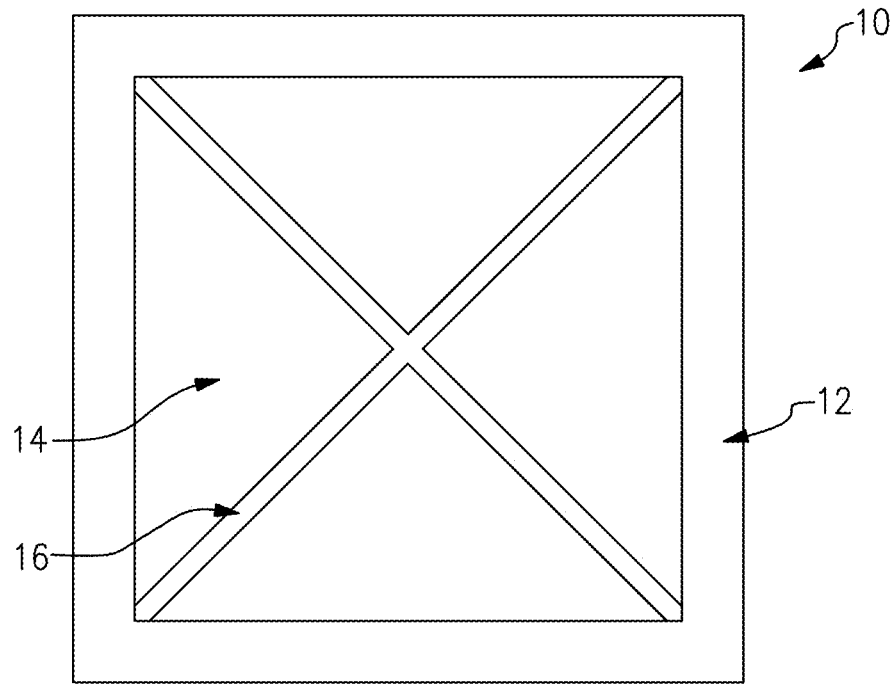
FIG. 3A is a schematic top view of a piezoelectric MEMS microphone.
Figure 3B:
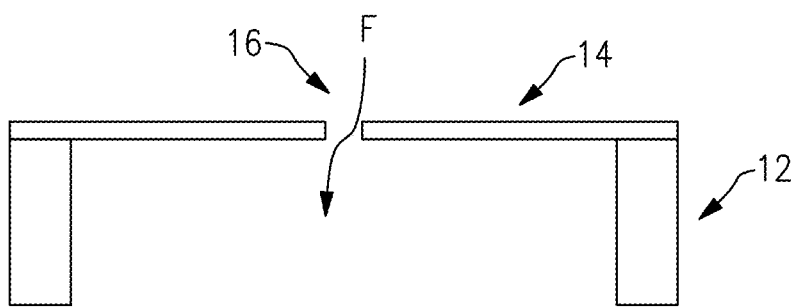
FIG. 3B is a schematic side view of the piezoelectric MEMS microphone of FIG. 3A.

FIGS. 3A-3B show a piezoelectric microelectromechanical systems (MEMS) microphone 10 (hereinafter the "microphone"). The microphone 10 has a substrate 12. The substrate 12 is optionally made of Silicon and may optionally have additional dielectric, metallic or semiconductor films deposited on it. The microphone 10 can have one or more piezoelectric sensors 14 (hereinafter "sensors") anchored to the substrate 12 in cantilever form with a gap 16 between adjacent sensors 14. The microphone 10 converts an acoustic signal to an electrical signal when a sound wave vibrates the sensors 14. The sensors 14 can be made from one or more layers of piezoelectric material. Optionally, the sensors 14 can be made at least in part of Aluminum Nitride (AlN). In another implementation, the sensors 14 can optionally be made at least in part of Scandium Aluminum Nitride (ScAlN). In other implementations, the sensors 14 can optionally be made at least in part of one of the following piezoelectric materials: Zinc Oxide (ZnO), Lead Zirconate Titanate (PZT), Polyvinylidene fluoride (PVDF, Lithium Niobate (LiNbO$_3$), Barium Titanate (BaTiO$_3$), Lead Magnesium Niobate-Lead Titanate (PMN-PT). The sensors 14 can include an electrode, which can optionally be made of aluminum (Al), molybdenum (Mo), titanium (Ti), titanium nitride (TiN), platinum (Pt), tantalum (Ta) or ruthenium (Ru), in some implementations. The gaps 16 between the sensors 14 allow the sensors 14 to freely move, for airflow F to pass therethrough, and balance the pressure between both sides of the sensors 14. The gap 16 can be about 100-500 nm wide. The sensors 14 are preferably planar (e.g., flat), but are generally not completely flat due to a material internal stress gradient in the sensors 14.

Figure 4A:
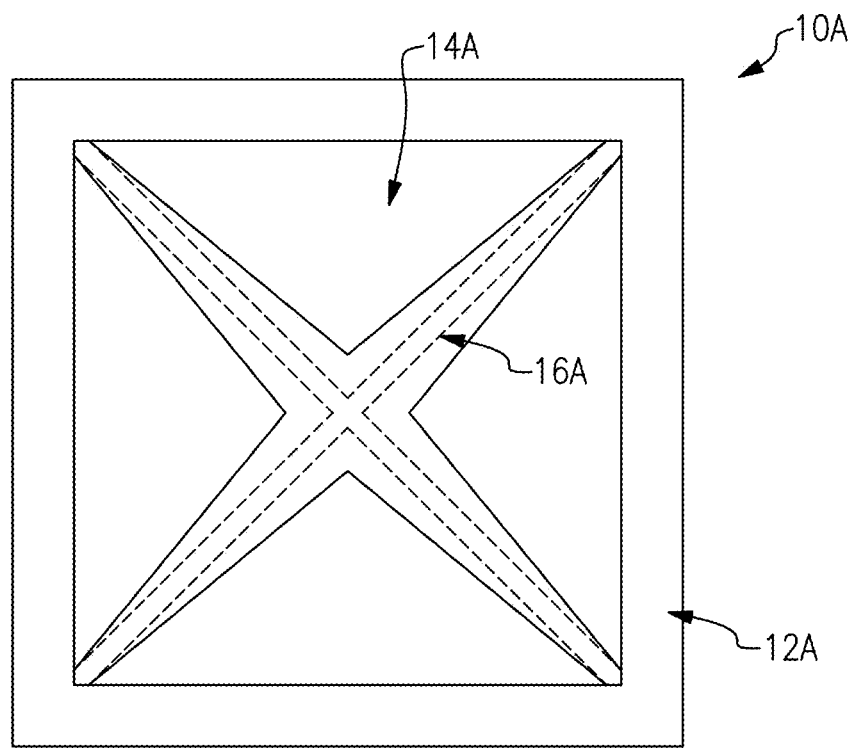
FIG. 4A is a schematic top view of a piezoelectric MEMS microphone.
Figure 4B:
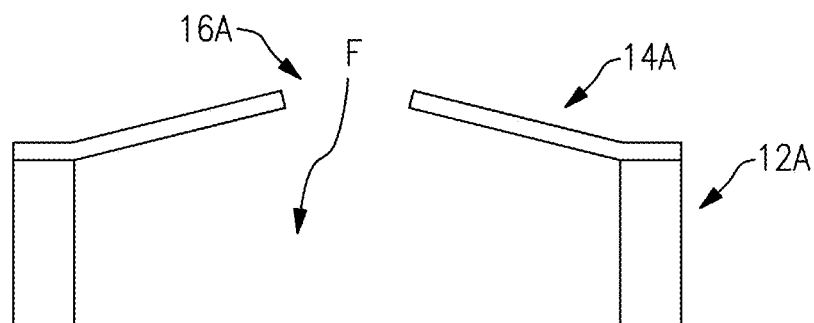
FIG. 4B is a schematic side view of the piezoelectric MEMS microphone of FIG. 4A.

FIGS. 4A-4B show a piezoelectric MEMS microphone 10A (hereinafter "microphone"). The microphone 10A is similar to the microphone 10 in FIGS. 3A-3B. Thus, references numerals used to designate the various components of the microphone 10A are identical to those used for identifying the corresponding components of the microphone 10 in FIGS. 3A-3B, except that an "A" has been added to the numerical identifier. Therefore, the structure and description for the various features of the microphone 10 in FIGS. 3A-3B are understood to also apply to the corresponding features of the microphone 10A in FIGS. 4A-4B, except as described below.

The microphone 10A differs from the microphone 10 in that the sensors 14A are bent upward due to the material's residual stress or stress gradient thereof, resulting in an increased width of the gaps 16A between sensors 14A. Though FIGS. 4A-4B show the sensors 14A bent upward, in other examples, the sensors 14A can bend downward due to material's residual stress or stress gradient thereof.

In use, the microphone 10, 10A is mounted on a printed circuit board (PCB) so that the substrate 12, 12A is disposed over or otherwise generally aligned with an opening in the PCB through which sound pressure enters the opening to deflect the sensors 14, 14A.

Figure 5:
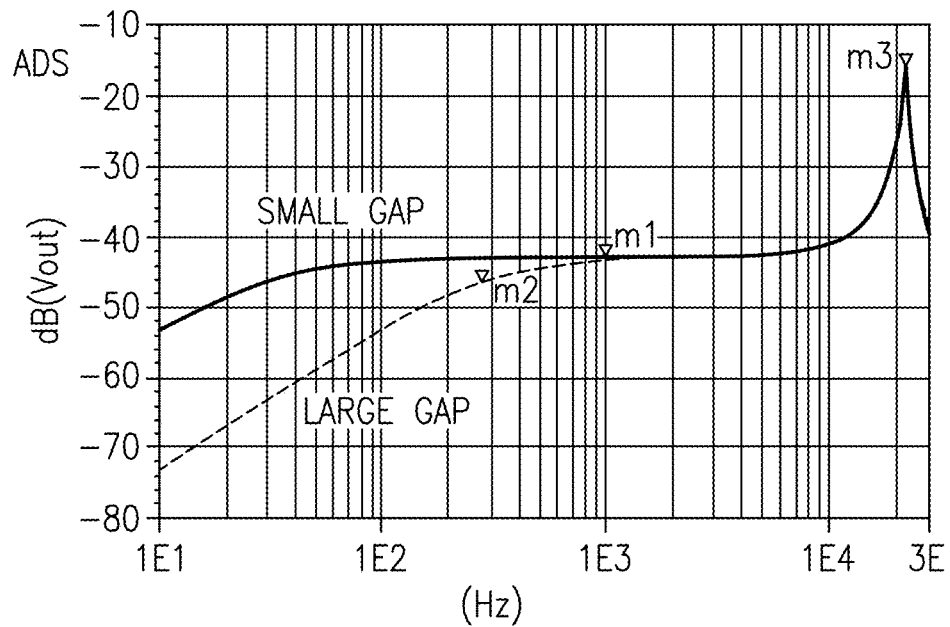
FIG. 5 is a graph of sensitivity versus frequency for the piezoelectric MEMS microphones in FIGS. 3A and 4A.

FIG. 5 shows a graph of sensitivity (in decibels or dB) versus frequency (in Hz). The solid line is representative of the performance of the microphone 10, where the sensors 14 are substantially planar (e.g. flat) and the gap 16 is substantially constant between the sensors 14 along their length. The dashed line is representative of the performance of the microphone 10A, where the sensors 14A are bent upward or downward and the width of the gap 16A varies between the sensors 14 along their length, which results in an increased reduction in acoustic resistance (e.g., because the gap 16A is larger). As shown in the graph, the performance of the microphone 10 provides better sensitivity in the low frequency range as compared to the performance of the microphone 10A. That is, changes in frequency in the low frequency range result in a smaller dB change for the microphone 10 than for the microphone 10A.

Figure 6:
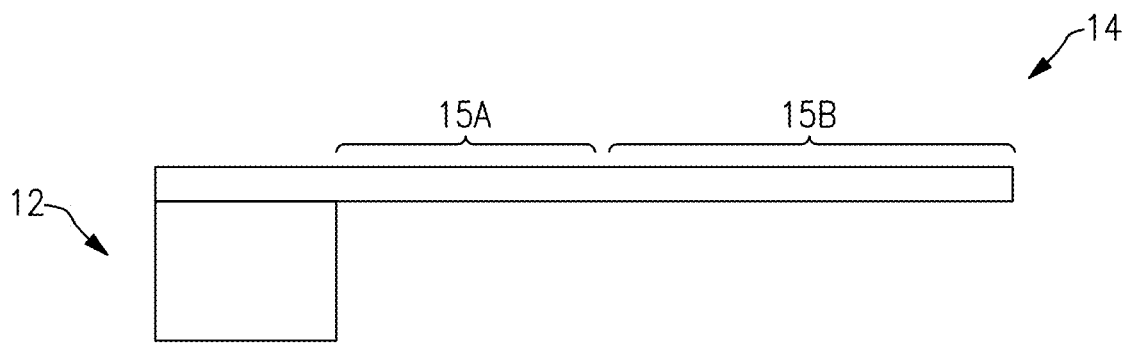
FIG. 6 is a schematic partial side view of a piezoelectric sensor used in a piezoelectric MEMS microphone.

FIG. 6 shows a side view of one of the sensors 14 anchored on the substrate 12. The sensor 14 has one or more sensing electrodes 15A over a proximal portion thereof proximate to (e.g., adjacent) the substrate 12. A distal portion 15B of the sensors 14 distal of the sensing electrodes 15A that extend to the free end of the sensors 14 do not have electrodes thereon. In one implementation, the distal portion 15B of the sensors 14 only has a mechanical function (e.g., receiving acoustic pressure thereon and deflecting or moving based on such pressure). In another implementation, the sensing electrode 15A extends at least partially into the distal portion 15B.

Acoustic Device with Directional Reinforcement

With continued reference to FIG. 6, the inventors have identified that increasing the rigidity of the distal portion 15B of the sensors 14 can advantageously increase the ability of the cantilevered sensor 14 to resist deflection, for example, due to material internal stress gradient, without affecting the sensitivity of the sensor 14. However, the inventors realized that increasing the rigidity of the distal portion 15B of the sensor 14 by increasing the mass of the distal portion 15B would negatively affect the operation of the sensor 14 as it affect the resonant frequency, where mass on the distal portion 15B would reduce the frequency, thereby affecting the sensitivity of the sensor 14.

Figure 7C:
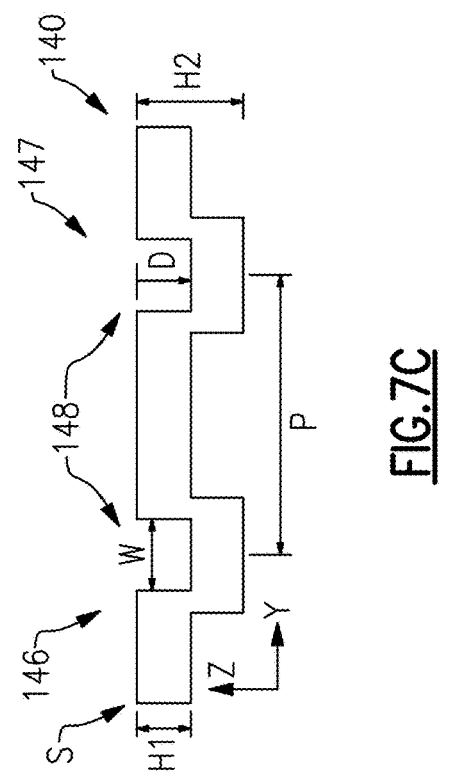
FIG. 7C is a schematic cross-sectional view of the piezoelectric sensor of FIG. 7A along line 7C-7C in FIG. 7A.
Figure 7A:
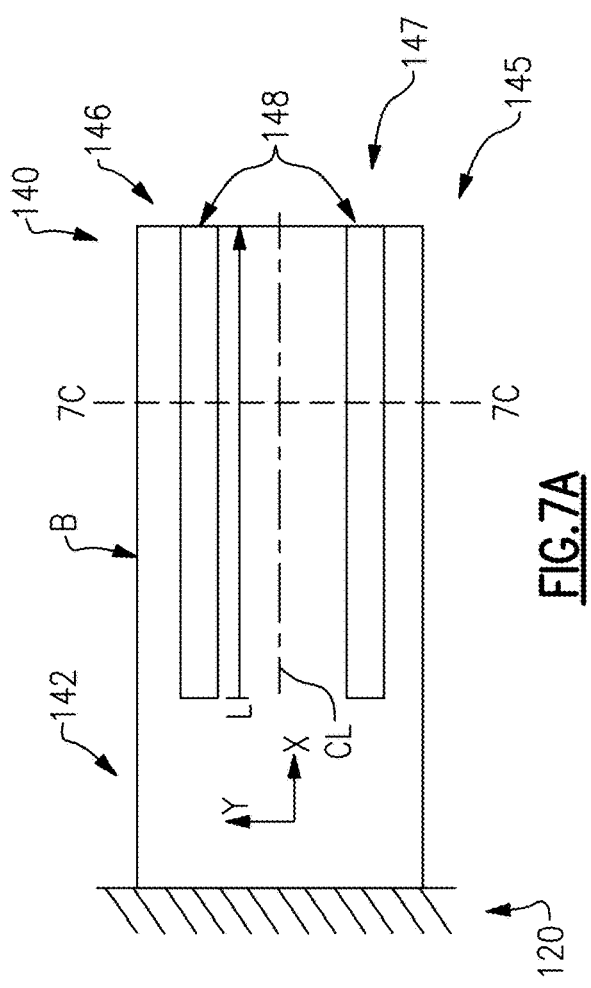
FIG. 7A is a schematic top view of a piezoelectric sensor.
Figure 7B:
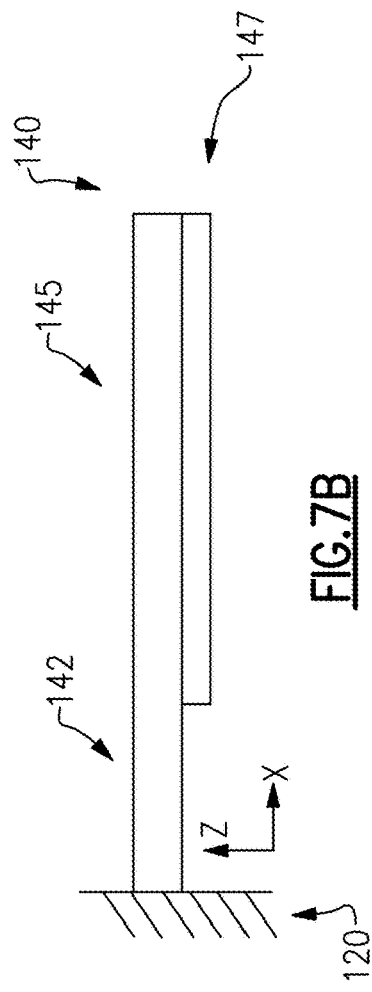
FIG. 7B is a schematic side view of the piezoelectric sensor of FIG. 7A.

FIGS. 7A-7C show a piezoelectric sensor 140 (hereafter "sensor") anchored to a substrate 120. The sensor 140 can be incorporated into a piezoelectric MEMS microphone, such as the microphone 10 described above (e.g., the microphone can have multiple sensors 140 cantilevered relative to the substrate 120, with gaps 16 between the sensors 140). The sensor 140 can be cantilevered relative to the substrate as shown in FIG. 7B.

The sensor 140 has a first portion 142 (e.g., proximal portion) that is proximate to (e.g., adjacent to) the substrate 120 and a second portion 145 (e.g., distal portion) that extends from the first portion 142 to a free end 146 (e.g., unsupported end) of the sensor 140. The sensor 140 can have one or more electrodes (not shown) in the first portion 142 (e.g., that in one implementation do not extend into the second portion 145). In some implementations, the sensors 140 can have one or more electrodes (not shown) in the first portion 142 that extend at least partially into the second portion 145. In some implementations, the sensor 140 can have multiple electrodes, for example, in the thickness direction of the sensor 140. For example, the sensor 140 (e.g., a 1 μm thick piezo layer) can have an electrode on top (e.g., on a top surface of the sensor beam), an electrode on bottom (e.g., on a bottom surface of the sensor beam) and/or an electrode in between a top surface and a bottom surface of the beam of the sensor 140. In one implementation, the sensor 140 can be made of one layer of material. In another implementation, the sensor 140 can be made of multiple layers or films of materials, where the multiple layers have the same or different material stress gradients (e.g., due to the material property of the layer or film).

The second portion 145 of the sensor 140 has a corrugated section 147. In the illustrated implementation, the corrugated section 147 has multiple (e.g. two) grooves or recesses 148 that are spaced apart from each other by a pitch P (e.g., where the grooves alternate with ridges or larger thickness portions of the beam) and extend generally in the same direction (X direction) as the beam B of the sensor 140. The grooves 148 can have a width W and depth D. In one implementation, the grooves 148 extend substantially parallel to a central longitudinal axis CL of the beam B. With reference to FIG. 7C, the grooves 148 can have a height H2 that is greater than a height H1 of side edges S of the beam B. In one implementation, the depth D of the grooves 148 is approximately twice the height H1 of the side edges S of the beam B. In one implementation, the depth D can be 1 μm. In one implementation, the height H2 of the grooves 148 is approximately double the height H1 of the side edges S of the beam B. One of skill will recognize that the corrugated section 147 can vary, for example, in the number of grooves 148, angle of the grooves 148 relative to the center line CL of the beam B, length L, depth D, width W and/or pitch P of the grooves 148 and fall within the scope of the invention. In some implementations, the length L can be between about 100 um and about 1 mm. In some implementations, the depth D can be between about 0.1 um and about 10 um. In some implementations, the width W can be between about 0.1 um and about 20 um. In some implementations, the pitch P can be between about 0.2 um and about 100 um.

Advantageously, the corrugated section 147 with the groove(s) 148 extending generally in the same direction (X direction) as the length of the beam B increases the rigidity of the beam B in the longitudinal direction of the beam B and restricts deflection or bending of the beam B in the Z direction, for example in response to material internal stress gradient of the beam B. This results in a smaller gap 16 between the sensors 140 when subjected to the sound pressure. Additionally, because the corrugated section 147 reduces or limits the bending of the distal portion of the beam B, this results in little to no effect on bending of the proximal portion of the sensor 140, and therefore it does not significantly affect the signal sensed by the electrodes of the sensor 140. Further, the corrugated section 147 restricts deflection of the beam B in the Z direction without adding to the mass or weight of the second portion 145 of the sensor 140. The corrugated section 147 allows the sensor 140 to deflect or bend in the width (or Y) direction of the beam B. Advantageously, the corrugated section 147 can result in a reduction of deflection of at least 20% (e.g., 20-60%) reduction as compared to a sensor without the corrugated section.

Figure 7D:
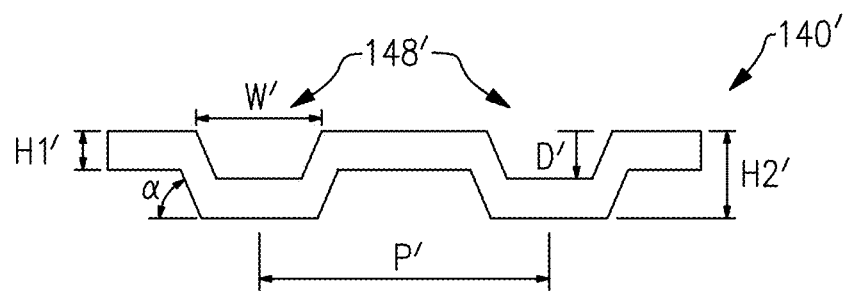
FIG. 7D is a schematic cross-sectional view of a piezoelectric sensor.

FIG. 7D shows a schematic cross-sectional side view of a piezoelectric sensor 140'. Some of the features of the piezoelectric sensor 140' are similar to features of the piezoelectric sensor 140 in FIGS. 7A-7C. Thus, reference numerals used to designate the various components of the piezoelectric sensor 140' are identical to those used for identifying the corresponding components of the piezoelectric sensor 140 in FIGS. 7A-7C, except that an "'" has been added to the numerical identifier. Therefore, the structure and description for the various features of the piezoelectric sensor 140 in FIGS. 7A-7C are understood to also apply to the corresponding features of the piezoelectric sensor 140' in FIG. 7D, except as described below.

The piezoelectric sensor 140' differs from the piezoelectric sensor 140 in that the walls of the grooves 148' extend at an angle α (e.g., a non-perpendicular angle) relative to the base of the grooves 148'. In some implementations the angle α can be between 10 degrees and 90 degrees. In one implementation, the angle α can be between 60-70 degrees, such as about 60 degrees. Advantageously, the angle α of the grooves 148' results in a more robust (e.g., stronger) corrugated section and inhibits defects therein.

Figure 7E:
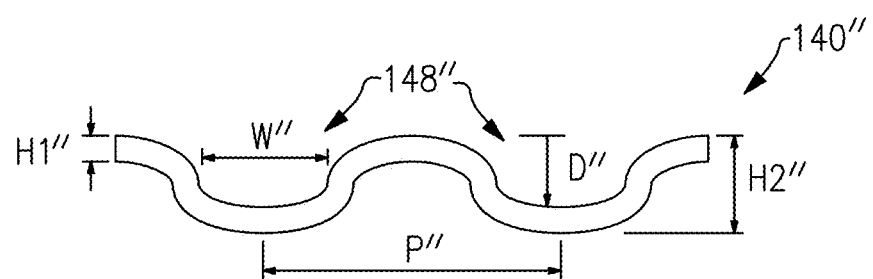
FIG. 7E is a schematic cross-sectional view of a piezoelectric sensor.

FIG. 7E shows a schematic cross-sectional side view of a piezoelectric sensor 140". Some of the features of the piezoelectric sensor 140" are similar to features of the piezoelectric sensor 140' in FIG. 7D. Thus, reference numerals used to designate the various components of the piezoelectric sensor 140" are identical to those used for identifying the corresponding components of the piezoelectric sensor 140' in FIG. 7D, except that an "''" instead of an "'"

has been added to the numerical identifier. Therefore, the structure and description for the various features of the piezoelectric sensor 140' in FIG. 7D are understood to also apply to the corresponding features of the piezoelectric sensor 140" in FIG. 7E, except as described below.

The piezoelectric sensor 140" differs from the piezoelectric sensor 140' in that the walls of the grooves 148" are not only inclined (extend at an angle, e.g., a non-perpendicular angle, relative to the base of the grooves 148"), but the grooves 148" are rounded. Advantageously, the rounded shape of the grooves 148" of the corrugated section of the piezoelectric sensor 140" can result in improved distribution of stress within the corrugated section (e.g., during operation of the sensor 140") and improved reliability of the piezoelectric sensor 140".

Figure 8:
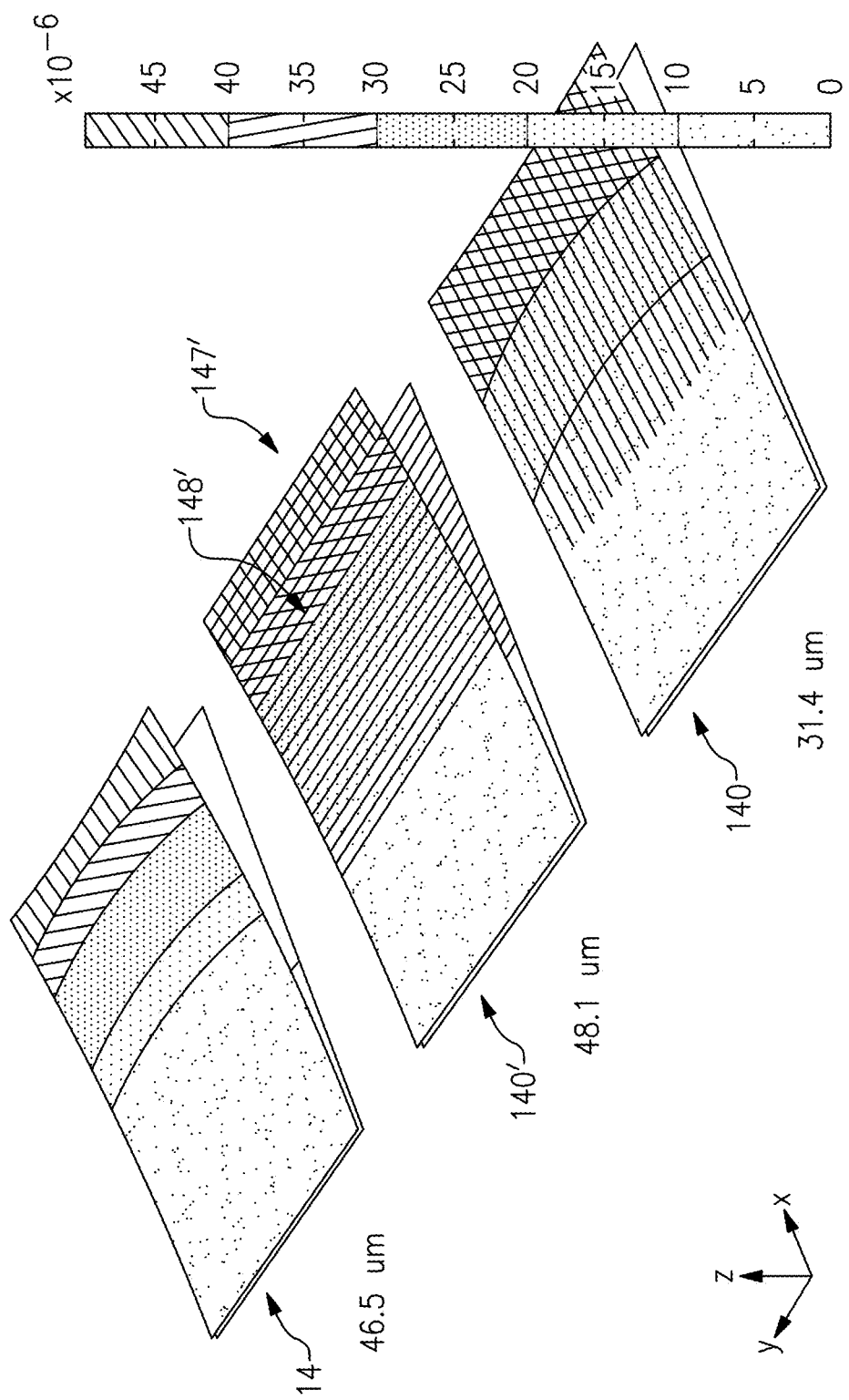
FIG. 8 are images of displacement in various piezoelectric sensor designs.

FIG. 8 shows a comparison of deflection (in μm) between different piezoelectric sensor designs, namely a sensor 14 without any corrugation, a sensor 140 with a corrugated section similar to the corrugated section 147 described above, and a sensor 140' with a corrugated section 147' that has grooves 148' extending generally transverse (e.g., perpendicular) to a longitudinal axis of the sensor 140'. As shown in FIG. 8, the sensor 140 with the corrugated section having grooves extended in the direction of the length of the beam has the smallest deflection, relative to the sensor 140 without any corrugation and relative to the sensor 140' with the corrugated section 147' with grooves 148' extending generally transverse (e.g., perpendicular) to the longitudinal direction of the sensor 140'.

Figure 9:
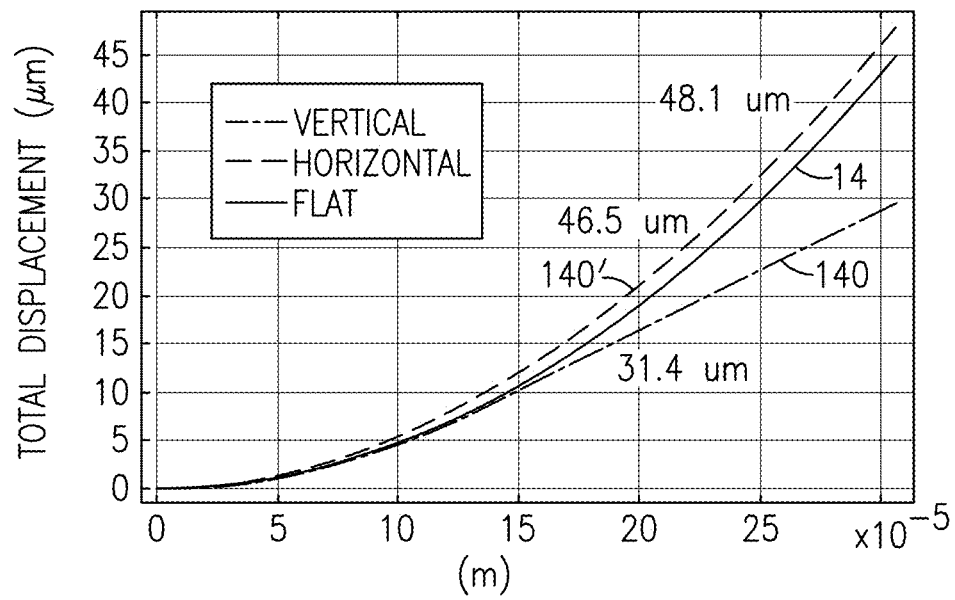
FIG. 9 is a graph of total displacement versus length for the piezoelectric sensor designs in FIG. 8.

FIG. 9 shows a graph of total displacement (in μm) along the length of the beam (in m) for the sensors 14, 140 and 140' shown in FIG. 8. In the graph, zero on the X-axis corresponds to the location where the beam B joins the substrate (e.g. substrate 120). FIG. 8 shows that the sensor 140 with the corrugated section 147 with grooves 148 extending in the same direction (X direction) as the length beam B exhibits a lower amount of deflection than the sensor 14 or sensor 140' (e.g., due to material internal stress gradient in the beam of the sensor). Additionally, as shown in FIG. 8, the increased rigidity provided by the corrugated section 147 of the sensor 140 to the second portion (distal portion) of the sensor 140 results in the second (distal) portion of the sensor 140 maintaining a generally linear configuration.

Figure 10:
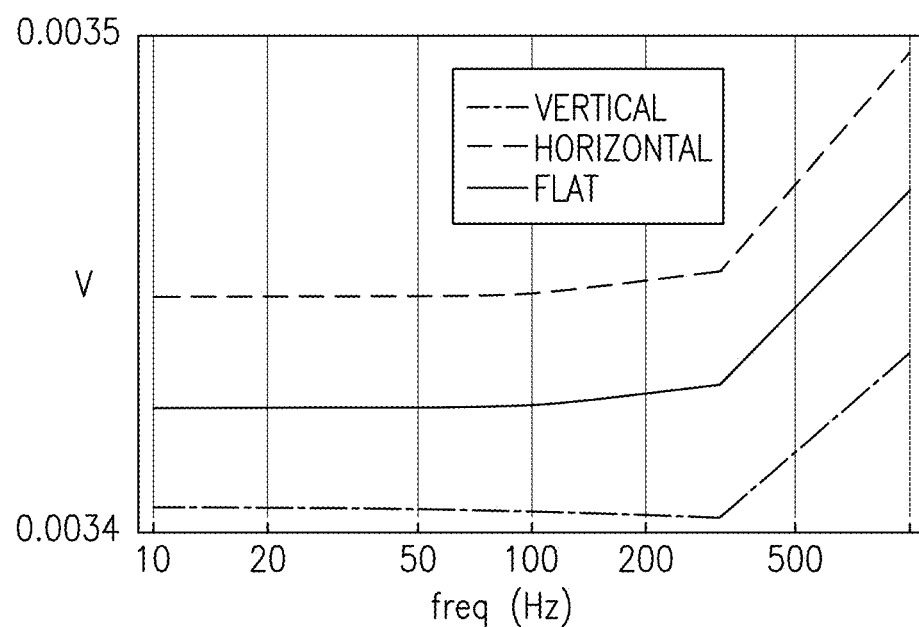
FIG. 10 is a graph of voltage versus frequency for the piezoelectric sensor designs in FIG. 8.

FIG. 10 shows a comparison of output voltage from the sensor versus frequency for the sensors 14, 140, 140' shown in FIG. 8. FIG. 10 indicates that the inclusion of the corrugated section 147 in the sensor 140 has minimal impact on output voltage provided by the sensor 140, as its output voltage increases by about 1% relative to the voltage performance of the sensor 14 without any corrugation. Accordingly, incorporation of the corrugated section 147 in the sensor 140, as described above, has minimal impact on the performance of the sensor 140.

Figure 11A:
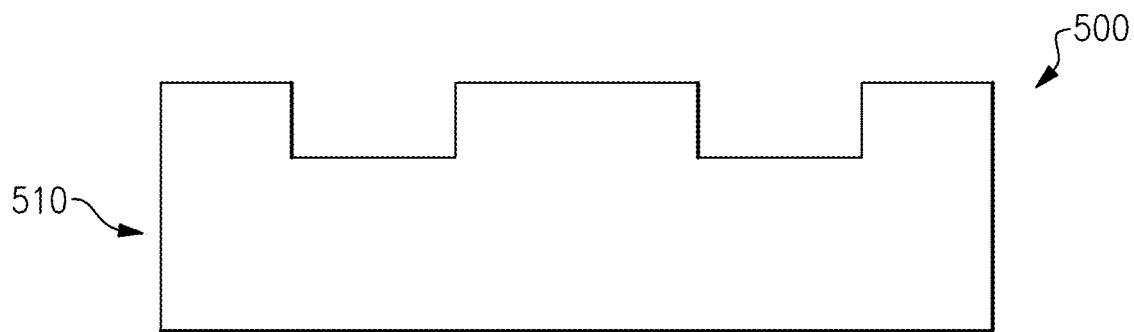
FIG. 11A is a cross-sectional side view of one step in the manufacture of a piezoelectric sensor.
Figure 11B:
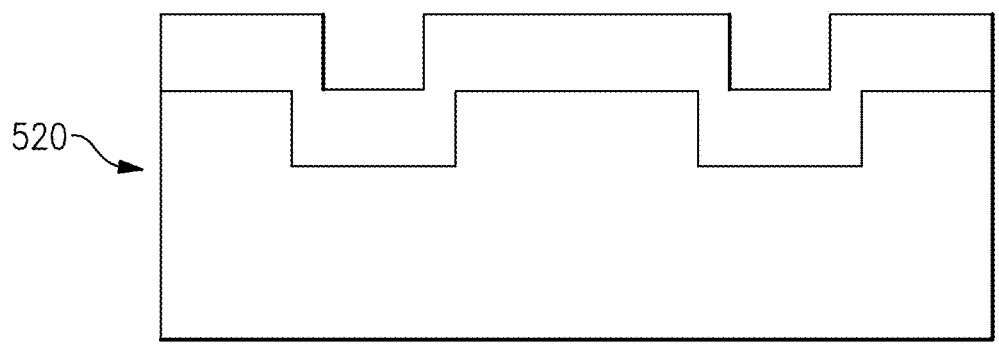
FIG. 11B is a cross-sectional side view of another step in the manufacture of a piezoelectric sensor.
Figure 11C:
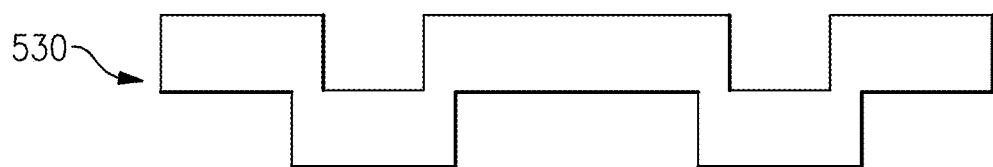
FIG. 11C is a cross-sectional side view of another step in the manufacture of a piezoelectric sensor.

FIGS. 11A-11C show cross-sectional views of structures illustrating steps of a method 500 of manufacturing a piezoelectric sensor, like the sensor 140, with a corrugated section, such as the corrugated section 147 described above. FIGS. 11A-11C show cross-sections of the mold and beam in the widthwise direction (e.g., Y direction in FIGS. 7A-7C).

FIG. 11A shows the step of forming or providing 510 a corrugated mold. The mold can be made of silicon, but other suitable materials can be used.

FIG. 11B shows the step of forming or depositing 520 a structure having one or more piezoelectric layers (e.g., one or more piezoelectric films) over the top surface of the mold to define the sensor beam with a proximal portion and a distal portion, the distal portion having a corrugated section including one or more grooves that correspond to the one or more grooves of the mold. For example, the one or more layers can be deposited onto the mold by one of many methods used for deposition of thin films, such as physical vapor deposition (PVD), Electron Beam Evaporation, Plasma Enhanced Chemical Vapor Deposition (PECVD), furnace deposition processes or a combination of these methods.

FIG. 11C shows the step of releasing or removing 530 the structure with the corrugated section from the mold to form the cantilevered beam. Optionally, the method 500 of forming the piezoelectric sensor 140 with the cantilevered beam having the corrugated section 147 can be incorporated into a method for manufacturing a piezoelectric MEMS microphone. For example, the step of releasing or removing 530 the structure with the corrugated section from the mold can include leaving a portion of the sensor beam attached to a substrate in a cantilevered manner to provide the cantilevered sensor 140 with the corrugated section that can deflect, for example, when subjected to sound pressure.

Figure 12A:
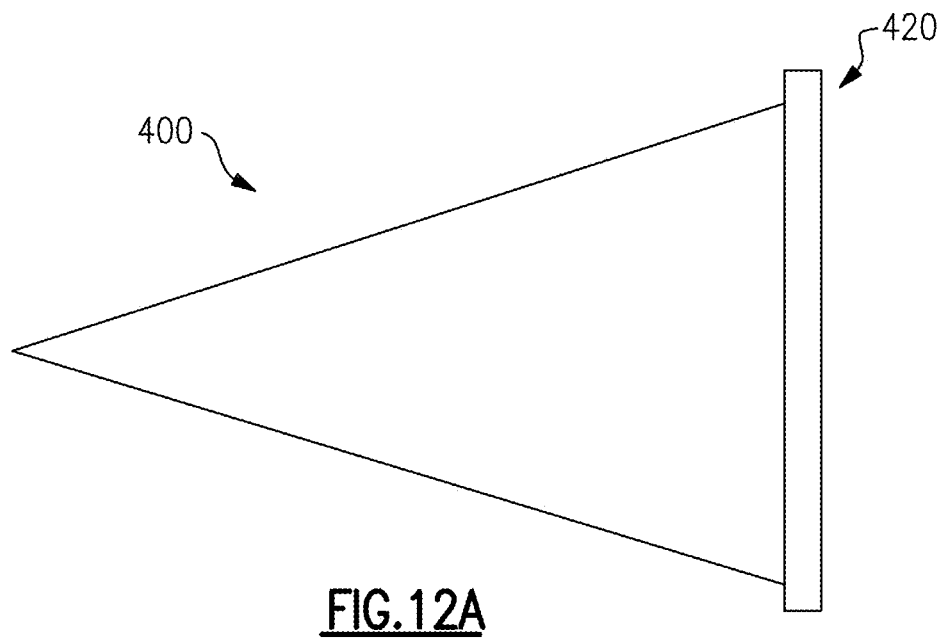
FIG. 12A is a schematic top view of a piezoelectric sensor.
Figure 13A:
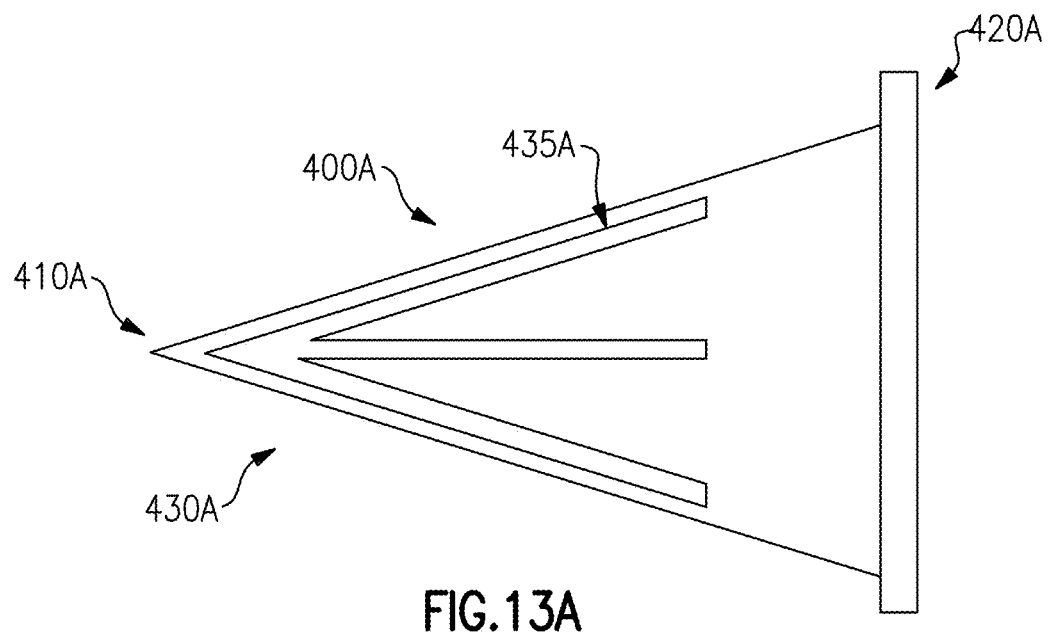
FIG. 13A is a schematic top view of a piezoelectric sensor.

FIGS. 12A and 13A show triangular shaped sensors 400, 400A anchored to a substrate 420, 420A along one edge. The sensor 400 is similar to the sensor 14 in FIG. 3A and has no corrugated section. The sensor 400A has a corrugated section 430A with multiple (e.g., three) grooves 435A that extend from the cantilevered or free end 410A of the sensor 400A toward the substrate 420A. The grooves 435 of the corrugated section 430A extend at a non-parallel angle relative to each other (e.g., joining proximate the free end 410A and flaring out or diverging toward the substrate 420A).

Figure 12B:
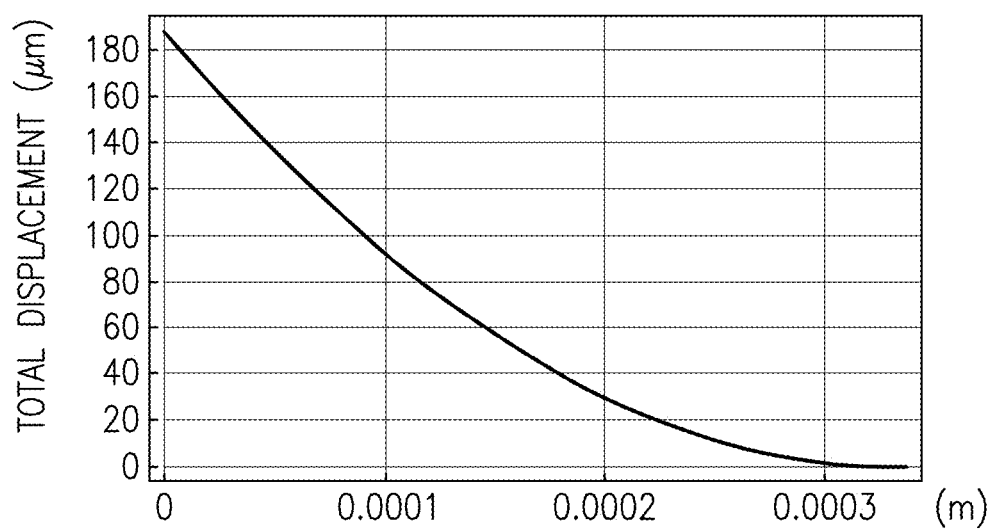
FIG. 12B is a graph of total displacement versus length for the piezoelectric sensor of FIG. 12A.
Figure 13B:
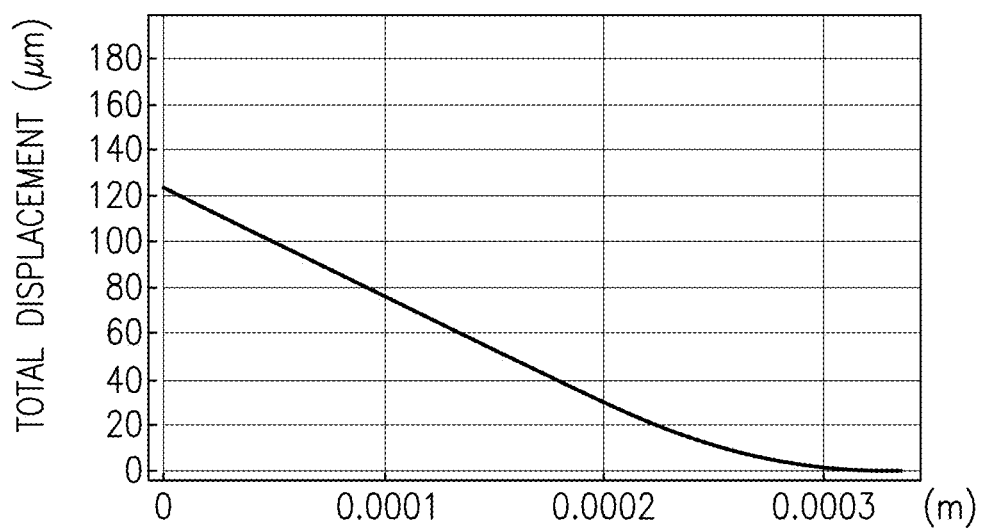
FIG. 13B is a graph of total displacement versus length for the piezoelectric sensor of FIG. 13A.

FIGS. 12B and 13B are graphs of total displacement (in um) along the length of the beam for the sensors 400, 400A shown in FIGS. 12A and 13A, respectively. In the graphs, the right hand side on the X-axis corresponds to the juncture between the sensors 400, 400A and their respective substrate 420, 420A. As shown in FIGS. 12B and 13B, the corrugated section 430A with non-parallel grooves 435A of the sensor 400A exhibits a lower total displacement than the sensor 400 that does not have a corrugated section. Advantageously, even where the grooves 435A extend in a non-parallel direction relative to each other, the sensor 400A with the corrugated section 430A exhibits a lower amount of deflection than the sensor 400 without a corrugated section (e.g., due to material internal stress gradient in the beam of the sensor). Additionally, the increased rigidity provided by the corrugated section 430A of the sensor 400A results in the second (distal) portion of the sensor 400A maintaining a generally linear configuration.

FIGS. 14A-14E show different examples of corrugated sections that can be incorporated into a beam of a piezoelectric sensor (such as the sensors 140, 400, 400A described above).

Figure 14A:
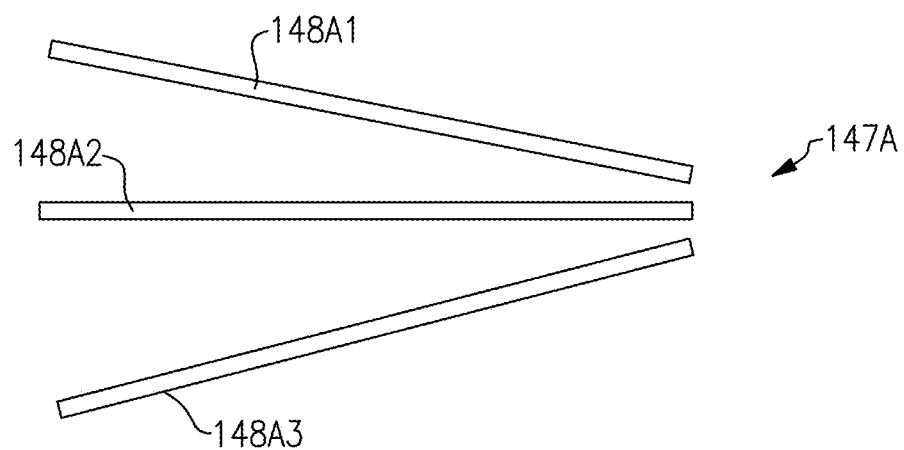
FIGS. 14A-14K are schematic views of a corrugated section in a piezoelectric sensor.

FIG. 14A shows an example corrugated section 147A with grooves 148A1, 148A2, 148A3 that are (linear and) angled relative to each other. In one example, the grooves 148A1, 148A2, 148A3 taper toward each other at one end and move away from each other at an opposite end. The corrugated section 147A can be symmetrical about the center groove 148A2.

Figure 14B:
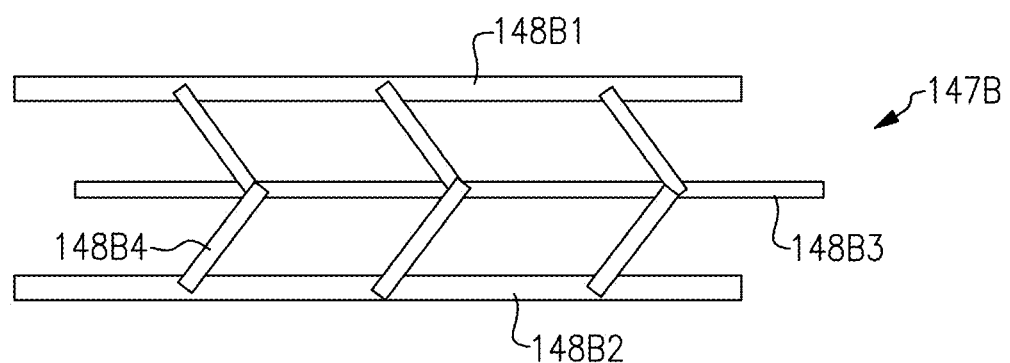

FIG. 14B shows an example corrugated section 147B with three linear grooves 148B1, 148B2, 148B3 that are spaced apart from each other and extend parallel to each other, the groove 148B3 disposed between the other two grooves 148B1, 148B2. The corrugated section 147B also has a plurality of angled grooves 148B4 that interconnect the center groove 148B3 with the outer grooves 148B1, 148B2. The angled grooves 148B4 can extent at a non-parallel and non-perpendicular angle relative to the grooves 148B1, 148B2, 148B3. For example, the angled grooves 148B4 can extend at an acute angle relative to the outer grooves 148B1, 148B2. Angled grooves 148B4 between the center groove 148B3 and outer groove 148B1 can extend generally at the same angle, and grooves 148B4 between the center groove 148B3 and outer groove 148B2 can extend generally at the same angle. The corrugated section 147B can be symmetrical about the center groove 148B3.

Figure 14C:
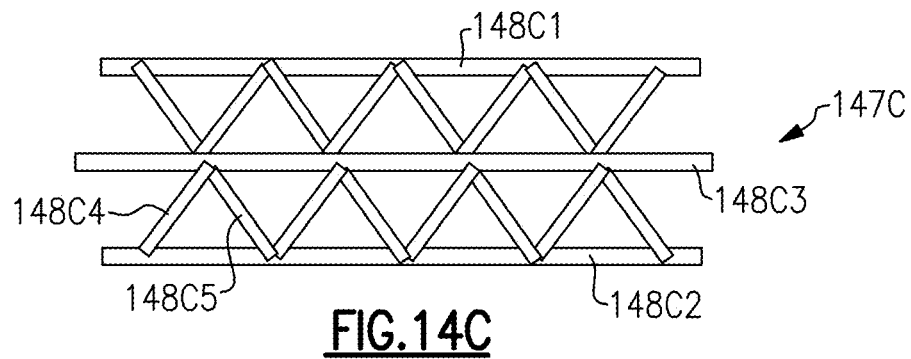

FIG. 14C shows an example corrugated section 147C with three linear grooves 148C1, 148C2, 148C3 that are spaced apart from each other and extend parallel to each other, the groove 148C3 disposed between the other two grooves 148C1, 148C2. The corrugated section 147C also has a plurality of first angled grooves 148C4 that interconnect the center groove 148C3 with the outer grooves 148C1, 148C2 and extend in one direction and a plurality of second angled grooves 148C5 that interconnect the center groove 148C3 with the outer grooves 148C1, 148C2 and extend in an opposite direction as the first angled grooves 148C4. The first and second angled grooves 148C4, 148C5 define a generally V shape. The first and second angled grooves 148C4, 148C5 can extend at a non-parallel and non-perpendicular angle relative to the grooves 148C1, 148C2, 148C3. For example, the first angled grooves 148C4 can extend generally at the same angle relative to the outer grooves 148C1, 148C2 and the second angled grooves 148C5 can extend generally at the same angle relative to the outer grooves 148C1, 148C2. The corrugated section 147C can be symmetrical about the center groove 148C3.

Figure 14D:
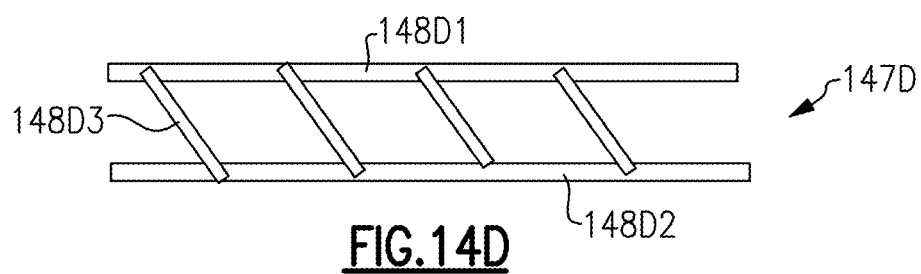

FIG. 14D shows an example corrugated section 147D with two linear grooves 148D1, 148D2 that are spaced apart from each other and extend parallel to each other. The corrugated section 147D also has a plurality of angled grooves 148D3 that interconnect the grooves 148D1, 148D2. The angled grooves 148D3 can extend at a non-parallel and non-perpendicular angle relative to the grooves 148D1, 148D2. For example, the angled grooves 148D3 can extend at an acute angle relative to the grooves 148D1. The angled grooves 148D3 between the grooves 148D1, 148D2 can extend generally at the same angle.

Figure 14E:
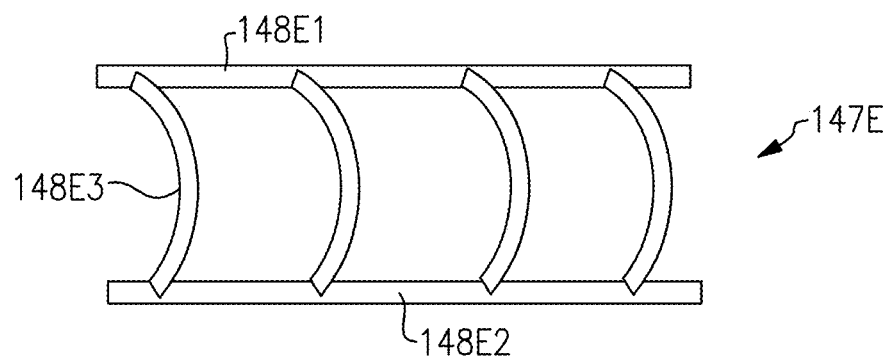

FIG. 14E shows an example corrugated section 147E with two linear grooves 148E1, 148E2 that are spaced apart from each other and extend parallel to each other. The corrugated section 147E also has a plurality of curved grooves 148E3 that interconnect the grooves 148E1, 148E2. The curved grooves 148E3 can optionally be defined by a constant radius (e.g., have a circular curvature).

The sensors 140, 410A described above included corrugated sections 147, 430A to strengthen the distal portion of the sensors 140, 410A and reduce bending of the sensor 140, 410A (e.g., of the distal portion of the sensors 140, 410A). In other implementations, discussed below, beams can be added to the sensors (e.g., via an additive process) to reduce bending, such as where sensor resonant frequency reduction due to additional mass is not a concern.

Figure 14F:
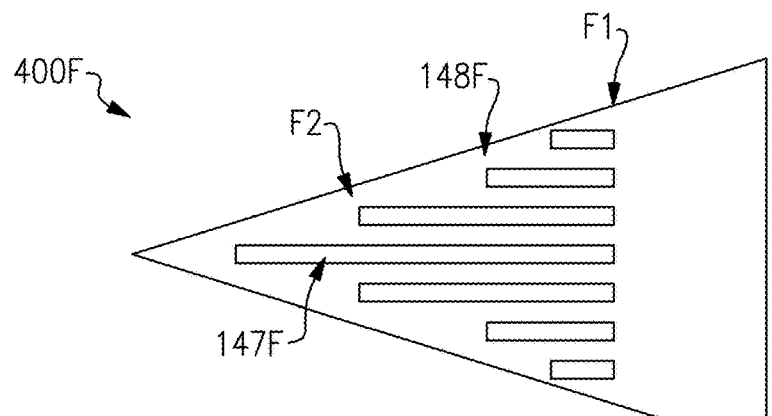

FIG. 14F shows a schematic top view of a piezoelectric sensor 400F.

Some of the features of the piezoelectric sensor 400F are similar to features of the piezoelectric sensor 400A in FIG. 13A. Thus, reference numerals used to designate the various components of the piezoelectric sensor 400F are identical to those used for identifying the corresponding components of the piezoelectric sensor 400A in FIG. 13A, except that an "F" instead of an "A" has been added to the numerical identifier. Therefore, the structure and description for the various features of the piezoelectric sensor 400A in FIG. 13A are understood to also apply to the corresponding features of the piezoelectric sensor 14F in FIG. 14F, except as described below.

The piezoelectric sensor 400F differs from the piezoelectric sensor 400A in that the corrugated section 147F includes multiple linear grooves 148F of different lengths that are formed in the sensor 400F, which has a triangular shape. Each of the grooves 148F extends from a proximal end F1 to a distal end F2. In the illustrated implementation, all of the grooves 148F have proximal ends F1 that are aligned with each other (e.g., end adjacent an imaginary straight line), and the distal end F2 of each of the grooves 148F differs from the distal end F2 of at least one other of the grooves 148F. The grooves 148F can in some implementations have a cross-sectional shape similar to that of the grooves 148, 148' or 148" in FIGS. 7C-7E.

Figure 14G:
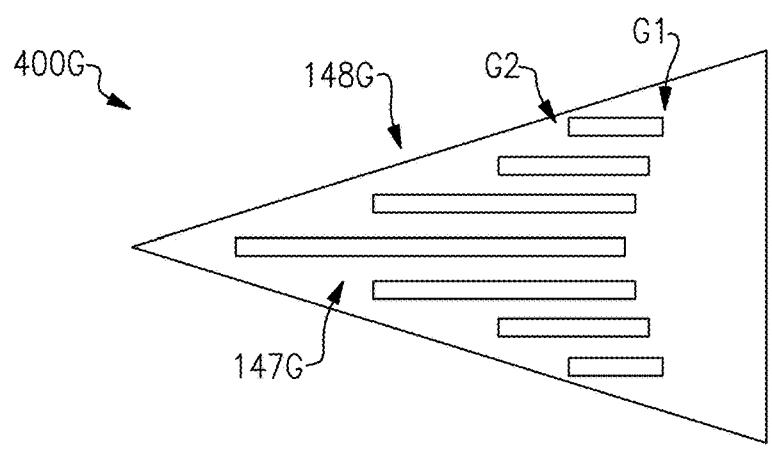

FIG. 14G shows a schematic top view of a piezoelectric sensor 400G.

Some of the features of the piezoelectric sensor 400G are similar to features of the piezoelectric sensor 400F in FIG. 14F. Thus, reference numerals used to designate the various components of the piezoelectric sensor 400G are identical to those used for identifying the corresponding components of the piezoelectric sensor 400F in FIG. 14F, except that a "G" instead of an "F" has been added to the numerical identifier. Therefore, the structure and description for the various features of the piezoelectric sensor 400F in FIG. 14F, which is based on the description of the piezoelectric sensor 400A, are understood to also apply to the corresponding features of the piezoelectric sensor 14G in FIG. 14G, except as described below.

The piezoelectric sensor 400G differs from the piezoelectric sensor 400F in that the corrugated section 147G has multiple linear grooves 148G of different lengths, where the proximal ends G1 of the grooves 148G are not aligned (e.g., do not end adjacent an imaginary straight line). As shown in FIG. 14G, the grooves 148G closer to the centerline of the sensor 148G have proximal ends G1 that are located distally of the proximal ends G1 of grooves 148G closer to the side edges of the piezoelectric sensor 400G. Such an arrangement (e.g., not aligned) of the proximal ends G1 of the grooves 148G can advantageously inhibit the concentration of stress at the proximal ends G1 of the grooves 148G. In one implementation, the proximal end G1 of one groove 148G can be offset from the proximal end G1 of an adjacent groove 148G by about 1 um to 2 um.

Figure 14H:
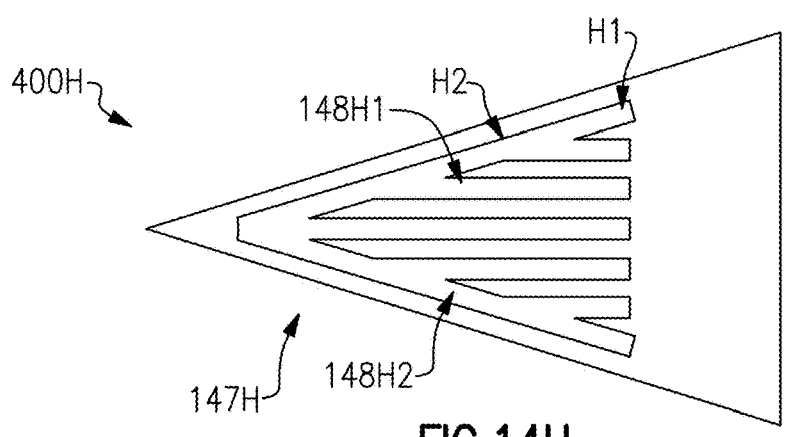

FIG. 14H shows a schematic top view of a piezoelectric sensor 400H. Some of the features of the piezoelectric sensor 400H are similar to features of the piezoelectric sensor 400F in FIG. 14F. Thus, reference numerals used to designate the various components of the piezoelectric sensor 400H are identical to those used for identifying the corresponding components of the piezoelectric sensor 400F in FIG. 14F, except that an "H" instead of an "F" has been added to the numerical identifier. Therefore, the structure and description for the various features of the piezoelectric sensor 400F in FIG. 14F, which is based on the description of the piezoelectric sensor 400A, are understood to also apply to the corresponding features of the piezoelectric sensor 14H in FIG. 14H, except as described below.

The piezoelectric sensor 400H differs from the piezoelectric sensor 400F in that it includes edge grooves 148H2 that confine the distal ends of the linear grooves 148H1 (e.g., the distal ends H2 of the linear grooves 148H1 end at the edge grooves 148H2). The edge grooves 148H2 can optionally extend parallel to side edges of the piezoelectric sensor 400H.

Figure 14I:
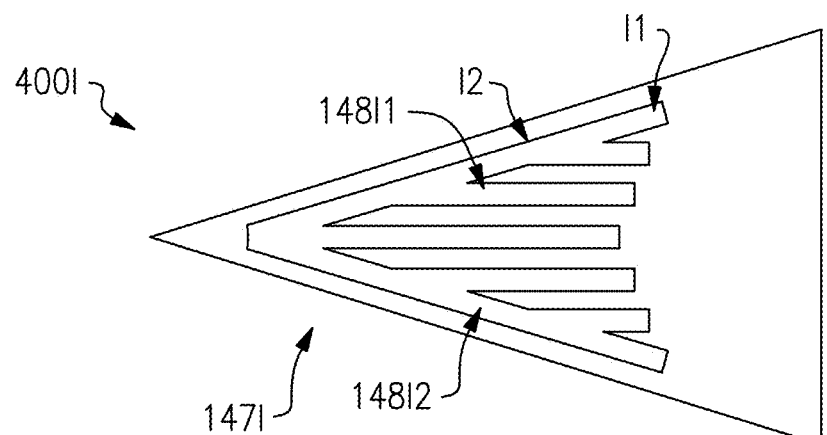

FIG. 14I shows a schematic top view of a piezoelectric sensor 400I.

Some of the features of the piezoelectric sensor 400I are similar to features of the piezoelectric sensor 400G in FIG. 14G. Thus, reference numerals used to designate the various components of the piezoelectric sensor 400I are identical to those used for identifying the corresponding components of the piezoelectric sensor 400G in FIG. 14G, except that an "I" instead of a "G" has been added to the numerical identifier. Therefore, the structure and description for the various features of the piezoelectric sensor 400G in FIG. 14G, which is based on the description of the piezoelectric sensor 400A, are understood to also apply to the corresponding features of the piezoelectric sensor 14I in FIG. 14I, except as described below.

The piezoelectric sensor 400I differs from the piezoelectric sensor 400G in that it includes edge grooves 148I2 that confine the distal ends of the linear grooves 148I1 (e.g., the distal ends 12 of the linear grooves 148I1 end at the edge grooves 148I2). The edge grooves 148I2 can optionally extend parallel to side edges of the piezoelectric sensor 400I.

Figure 14J:
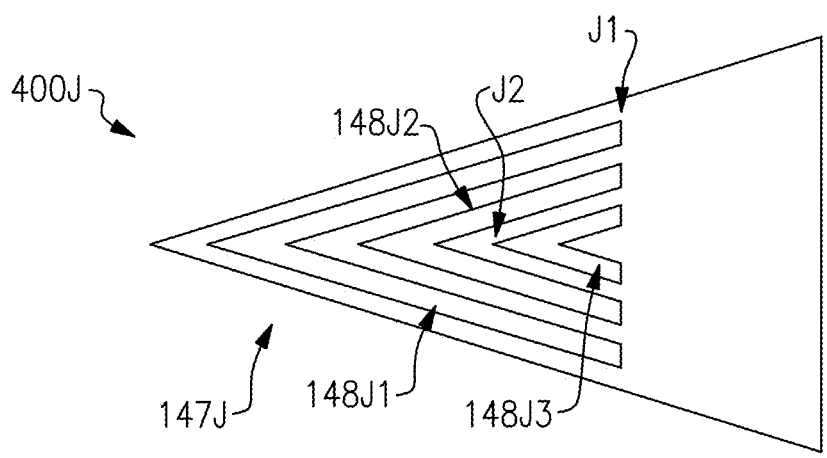

FIG. 14J shows a schematic top view of a piezoelectric sensor 400J.

Some of the features of the piezoelectric sensor 400J are similar to features of the piezoelectric sensor 400A in FIG. 13A. Thus, reference numerals used to designate the various components of the piezoelectric sensor 400J are identical to those used for identifying the corresponding components of the piezoelectric sensor 400A in FIG. 13A, except that a "J" instead of an "A" has been added to the numerical identifier. Therefore, the structure and description for the various features of the piezoelectric sensor 400A in FIG. 13A are understood to also apply to the corresponding features of the piezoelectric sensor 14J in FIG. 14J, except as described below.

The piezoelectric sensor 400J differs from the piezoelectric sensor 400A in that the corrugated section 147J includes multiple linear grooves 148J1, 148J2, 148J3 of different lengths that are formed in the sensor 400J, which has a triangular shape. The grooves 148J1, 148J2, 148J3 extend at an angle relative to a centerline of the piezoelectric sensor 400J so that distal ends J2 of each pair of grooves 148J1, 148J2, 148J3 join each other (e.g., in the shape of a V). In one implementation, the grooves 148J1, 148J2, 148J3 extend substantially parallel to one of the side edges of the piezoelectric sensor 400J. The proximal ends J1 of the grooves 148J1, 148J2, 148J3 are aligned with each other (e.g., end adjacent an imaginary straight line).

Figure 14K:
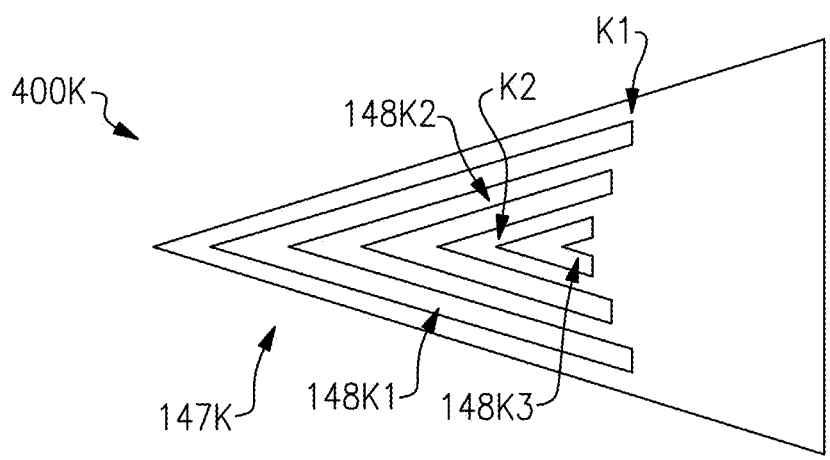

FIG. 14K shows a schematic top view of a piezoelectric sensor 400K.

Some of the features of the piezoelectric sensor 400K are similar to features of the piezoelectric sensor 400J in FIG. 14J. Thus, reference numerals used to designate the various components of the piezoelectric sensor 400K are identical to those used for identifying the corresponding components of the piezoelectric sensor 400J in FIG. 14J, except that a "K" instead of a "J" has been added to the numerical identifier. Therefore, the structure and description for the various features of the piezoelectric sensor 400J in FIG. 14J, which is based on the description of the piezoelectric sensor 400A, are understood to also apply to the corresponding features of the piezoelectric sensor 14K in FIG. 14KG, except as described below.

The piezoelectric sensor 400K differs from the piezoelectric sensor 400J in that the corrugated section 147K has multiple grooves 148K1, 148K2, 148K34 of different lengths and that extend at an angle relative to a centerline of the piezoelectric sensor 400K so that distal ends K2 of each pair of grooves 148K1, 148K2, 148K3 join each other (e.g., in the shape of a V). The proximal ends K1 of the grooves 148K1, 148K2, 148K3 are not aligned (e.g., do not end adjacent an imaginary straight line). As shown in FIG. 14K, the grooves 148K3 closer to the centerline of the sensor 148K have proximal ends K1 that are located distally of the proximal ends K1 of grooves 148K1 closer to the side edges of the piezoelectric sensor 400K. Such an arrangement (e.g., not aligned) of the proximal ends K1 of the grooves 148K1, 148K2, 148K3 can advantageously inhibit the concentration of stress at the proximal ends K1 of the grooves 148K1, 148K2, 148K3. In one implementation, the proximal end K1 of one groove 148K3 can be offset from the proximal end K1 of an adjacent groove 148K2 by about 1 um to 2 um.

Figure 15A:
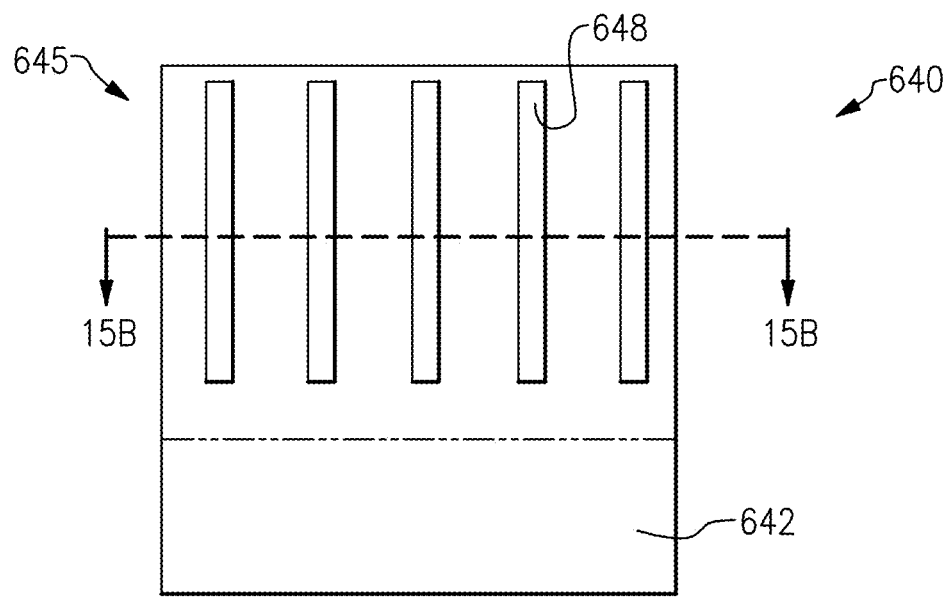
FIG. 15A is a top view of a piezoelectric sensor.

FIG. 15A shows a top view of a piezoelectric sensor 640 (hereafter "sensor") with a proximal portion 642 and a distal portion 645. One or more beams 648 can extend over the at least a portion of the distal portion 645. In one implementation, the beam(s) 648 can extend linearly. In one implementation, the beam(s) 648 can be spaced apart from each other (e.g., at constant intervals) and extend parallel to each other. In one implementation, the beam(s) 648 can extend parallel to a central axis of the sensor 640. The beam(s) 648 can strengthen the distal portion 645 of the sensor 640 to reduce bending of the sensor 640 (e.g., bending of the distal portion 645), such as due to sound pressure.

The beam(s) 648 can in one implementation have a length of between 50 μm and 500 μm. In one implementation, the beam(s) 648 can have a width of between 0.1 μm and 10 μm. In one implementation, the beam(s) 648 can have a height of between 0.1 μm and 1 μm.

In one implementation, the beam(s) 648 can include a dielectric material, such as one or more of Silicon oxide, Silicon nitride, and silicon-oxynitrides; other suitable dielectric materials are possible. In one implementation, the beam(s) 648 can include a metal, such as aluminum (Al), copper (Cu), platinum (Pt), ruthenium (Ru), and Titanium (Ti); other suitable metals are possible. In one implementation, the beam(s) 148 can include a metal nitride, such as Tantalum Nitride (TaN), Titanium Nitride (TiN), Aluminum Nitride (AlN), and Scandium Aluminum Nitride (ScAlN); other suitable metal nitrides are possible. In one implementation the beam(s) 648 can include amorphous silicon.

Figure 15B:
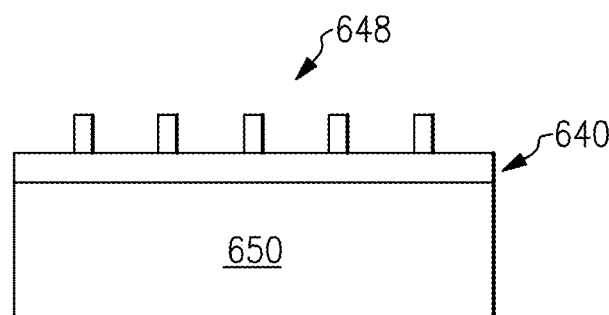
FIG. 15B is a cross-sectional side view of a step in the manufacture of a piezoelectric sensor.

FIG. 15B shows a cross-section of the sensor 640 during a step in a manufacturing process (e.g., additive process) of the sensor 640. The sensor 640 can be formed on a substrate 650. The substrate 650 is optionally made of Silicon and may optionally have additional dielectric, metallic or semiconductor films deposited on it. The sensor beam 640 can be defined by one or more piezoelectric layers (e.g., one or more piezoelectric films) formed or deposited over the top surface of the substrate 650. The one or more beam(s) 648 can be formed or deposited over a top surface of the sensor beam 640 (e.g., over the distal portion 645 of the sensor beam 640) by depositing (e.g., sputtering) the material of the beam(s) 648 over the sensor beam 640 structure, and patterning of the material to form the beam(s) 648.

Figure 15C:
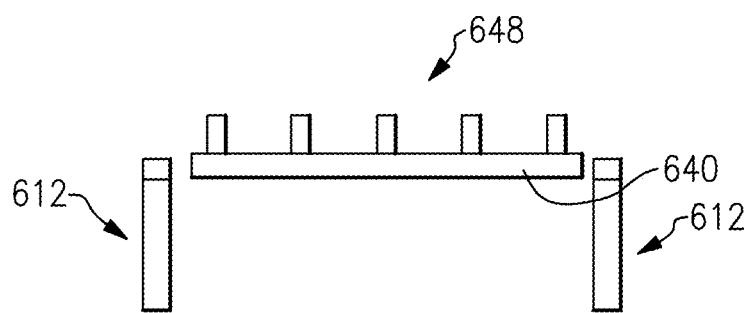
FIG. 15C is a cross-sectional side view of another step in the manufacture of a piezoelectric sensor.

FIG. 15C shows the step of releasing or removing the sensor beam 640 with the beam(s) 648 on its top surface from the substrate 650, leaving a portion 612 of the substrate 650 on either side of the cantilever sensor beam 640 (with the beams 648) that can deflect, for example, when subjected to sound pressure. The portion 612 and sensor beam 640 forms a structure with a cavity through which sound pressure travels to the sensor beam 640.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. Moreover, the devices described herein need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed devices.

What is claimed is:

1. A method of making a piezoelectric sensor for a piezoelectric microelectromechanical systems microphone, comprising:
    forming or providing a mold extending along a length and having two or more grooves in a top surface of the mold, the two or more grooves extending in a direction of the length of the mold to a distal end of the mold, the two or more grooves diverging from each other along their lengths;
    forming or depositing a structure having one or more piezoelectric layers over the top surface of the mold to define a beam with a proximal portion and a distal portion, the distal portion having a corrugated section including two or more grooves that correspond to the two or more grooves of the mold;
    forming an electrode or applying an electrode to the proximal portion of the structure; and
    releasing the structure from the mold to form one or more cantilever beams.

2. The method of claim 1 wherein the beam has a triangular profile.

3. A method of making a piezoelectric sensor for a piezoelectric microelectromechanical systems microphone, comprising:
    forming or providing a mold extending along a length and having one or more grooves in a top surface of the mold, the one or more grooves extending in a direction of the length of the mold to a distal end of the mold;
    forming or depositing a structure having one or more piezoelectric layers over the top surface of the mold to define a beam with a proximal portion and a distal portion, the distal portion having a corrugated section including one or more grooves that correspond to the one or more grooves of the mold, a thickness of the beam between a top surface of the beam and a bottom surface of the beam being greater in the corrugated section than in the proximal portion of the beam; and
    releasing the structure from the mold to form one or more cantilever beams.

4. A method of making an electronic device, comprising:
    forming or providing a printed circuit board that includes a substrate layer;
    forming or providing one or more piezoelectric microelectromechanical systems microphones via a process including (a) forming or providing a mold extending along a length and having one or more grooves in a top surface of the mold, the one or more grooves extending in a direction of the length of the mold to a distal end of the mold, (b) forming or depositing a structure having one or more piezoelectric layers over the top surface of the mold to define a beam with a proximal portion and a distal portion, the distal portion having a corrugated section including one or more grooves that correspond to the one or more grooves of the mold, (c) forming an electrode or applying an electrode to the proximal portion of the structure, (d) releasing the structure from the mold, and (e) leaving a part of the structure attached to a substrate in a cantilevered manner to form a cantilever beam that deflects when subjected to sound pressure, a thickness of the beam between a top surface and a bottom surface being greater in the corrugated section than in the proximal portion of the beam; and
    mounting the one or more piezoelectric microelectromechanical systems microphones on the printed circuit board.

5. The method of claim 4 wherein the corrugated section has two or more grooves.

6. The method of claim 5 wherein the two or more grooves extend parallel to each other.

7. The method of claim 5 wherein the two or more grooves extend parallel to a central longitudinal axis of the beam.

8. The method of claim 4 wherein the two or more grooves diverge from each other along their lengths.

9. The method of claim 4 wherein the beam has a triangular profile.

10. The method of claim 3 wherein the corrugated section has two or more grooves.

11. The method of claim 10 wherein the two or more grooves extend parallel to each other.

12. The method of claim 10 wherein the two or more grooves extend parallel to a central longitudinal axis of the beam.

13. The method of claim 10 wherein the two or more grooves diverge from each other along their lengths.

14. The method of claim 10 wherein the beam has a triangular profile.

* * * * *